(12) United States Patent
Yukimasa et al.

(10) Patent No.: US 12,388,165 B2
(45) Date of Patent: Aug. 12, 2025

(54) ANTENNA APPARATUS, COMMUNICATION APPARATUS, AND IMAGE CAPTURING SYSTEM

(71) Applicant: CANON KABUSHIKI KAISHA, Tokyo (JP)

(72) Inventors: Koji Yukimasa, Kanagawa (JP); Takeaki Itsuji, Kanagawa (JP); Yuki Kitazawa, Kanagawa (JP); Tatsuya Murao, Kanagawa (JP); Yasushi Koyama, Kanagawa (JP); Takahiro Sato, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 61 days.

(21) Appl. No.: 18/299,890

(22) Filed: Apr. 13, 2023

(65) Prior Publication Data

US 2023/0335885 A1 Oct. 19, 2023

(30) Foreign Application Priority Data

Apr. 15, 2022 (JP) ................. 2022-067825

(51) Int. Cl.
*H01Q 1/24* (2006.01)
*H03B 7/08* (2006.01)

(52) U.S. Cl.
CPC ............ *H01Q 1/24* (2013.01); *H03B 7/08* (2013.01)

(58) Field of Classification Search
CPC ........ H01Q 1/24; H01Q 21/065; H01Q 23/00; H03B 2200/0062; H03B 2200/0084; H03B 7/08
See application file for complete search history.

(56) References Cited

U.S. PATENT DOCUMENTS

| 6,456,215 B1 | 9/2002 | Frazier |
|---|---|---|
| 7,248,995 B2 | 7/2007 | Itsuji |
| 7,358,918 B2 | 5/2008 | Itsuji |

(Continued)

FOREIGN PATENT DOCUMENTS

| CN | 114270701 A | 4/2022 |
|---|---|---|
| JP | H05-067919 A | 3/1993 |

(Continued)

OTHER PUBLICATIONS

"Coherent Power Combination in Multi-Element Sub-THz RTD Oscillators Coupled with MIM Stub Structure", by Safumi Suzuki, Kenta Urayama, and Masahiro Asada, 20TH International Conference on Indium Phosphide and Related Materials, on May 25-29, 2008; and published in IEEE Xplore on Dec. 9, 2008.

(Continued)

*Primary Examiner* — Thien M Le
(74) *Attorney, Agent, or Firm* — VENABLE LLP

(57) ABSTRACT

An antenna apparatus that comprises an active antenna including an antenna, a semiconductor structure configured to operate as an oscillator, and at least two power lines configured to give a potential difference to the semiconductor structure, and configured to generate or detect an electromagnetic wave, and a control line electrically connected to one of the at least two power lines and configured to be injected with a signal for controlling a phase of the oscillator in the active antenna is provided.

23 Claims, 14 Drawing Sheets

(56) References Cited

U.S. PATENT DOCUMENTS

| | | |
|---|---|---|
| 7,542,000 B2 | 6/2009 | Itsuji |
| 7,560,695 B2 | 7/2009 | Kasai |
| 7,570,216 B2 | 8/2009 | Itsuji |
| 7,633,299 B2 | 12/2009 | Itsuji |
| 7,745,791 B2 | 6/2010 | Kasai |
| 7,884,767 B2 | 2/2011 | Itsuji |
| 7,919,752 B2 | 4/2011 | Itsuji |
| 7,922,659 B2 | 4/2011 | Itsuji |
| 7,924,107 B2 | 4/2011 | Koyama |
| 8,003,961 B2 | 8/2011 | Itsuji |
| 8,129,683 B2 | 3/2012 | Itsuji |
| 8,207,501 B2 | 6/2012 | Katagiri |
| 8,344,324 B2 | 1/2013 | Kasai |
| 8,451,069 B2 | 5/2013 | Sekiguchi |
| 8,618,486 B2 | 12/2013 | Itsuji |
| 8,686,916 B2 | 4/2014 | Yukimasa |
| 9,184,697 B2 | 11/2015 | Sekiguchi |
| 9,391,428 B2 | 7/2016 | Koyama |
| 9,825,369 B2 | 11/2017 | Takasaki |
| 9,899,959 B2 | 2/2018 | Feiginov |
| 10,897,073 B2 | 1/2021 | Sato |
| 11,300,602 B1* | 4/2022 | Kuppuswamy ...... G01R 31/346 |
| 11,442,338 B2 | 9/2022 | Itsuji |
| 11,616,918 B2 | 3/2023 | Sato |
| 11,626,839 B2 | 4/2023 | Koyama |
| 11,831,063 B2* | 11/2023 | Koyama ................. H03L 7/193 |
| 2005/0285541 A1 | 12/2005 | Lechevalier |
| 2010/0295729 A1 | 11/2010 | Nogami |
| 2014/0266477 A1 | 9/2014 | Sekiguchi |
| 2020/0067170 A1 | 2/2020 | Sato |
| 2020/0243458 A1* | 7/2020 | Yoshioka ............ H01L 31/0203 |
| 2021/0410100 A1* | 12/2021 | Balasubramanian ....................... H04W 4/021 |
| 2022/0057519 A1* | 2/2022 | Goldstein ............... G01S 17/88 |
| 2022/0099721 A1 | 3/2022 | Saito |
| 2022/0114769 A1* | 4/2022 | Omori ...................... G06T 7/70 |
| 2022/0173515 A1 | 6/2022 | Koyama |
| 2023/0110775 A1 | 4/2023 | Numata |
| 2023/0155292 A1* | 5/2023 | Koyama ............ H01Q 21/0075 343/893 |
| 2023/0163801 A1* | 5/2023 | Wiegner .................. H04B 1/40 455/552.1 |
| 2023/0207500 A1 | 6/2023 | Koyama |
| 2023/0208359 A1 | 6/2023 | Koyama |
| 2023/0284907 A1* | 9/2023 | Wang ................... A61B 5/0088 |
| 2023/0335885 A1* | 10/2023 | Yukimasa ................ H01Q 1/24 |

FOREIGN PATENT DOCUMENTS

| | | |
|---|---|---|
| JP | 2006-304006 A | 11/2006 |
| JP | 2014-200065 A | 10/2014 |
| JP | 2016-119647 A | 6/2016 |
| JP | 63-73010 B2 | 8/2018 |
| JP | 2020-36311 A | 3/2020 |
| JP | 2020-125927 A | 8/2020 |
| JP | 2020-141228 A | 9/2020 |
| JP | 2021-34908 A | 3/2021 |
| JP | 2021-52276 A | 4/2021 |
| JP | 2021-63781 A | 4/2021 |
| JP | 2022-23418 A | 2/2022 |
| KR | 20170004965 A | 1/2017 |
| KR | 20220008036 A | 1/2022 |
| WO | 2008/120826 A1 | 10/2008 |
| WO | 2009/107601 A1 | 9/2009 |

OTHER PUBLICATIONS

U.S. Appl. No. 18/299,917, filed Apr. 13, 2023, by Yasushi Koyama.
U.S. Appl. No. 18/305,804, filed Apr. 24, 2023, by Takeaki Itsuji.
U.S. Appl. No. 18/307,268, filed Apr. 26, 2023, by Yasushi Koyama.
"Theoretical analysis of coupled oscillator array using resonant tunneling diodes in subterahertz and terahertz range", by M. Asada and S. Suzuki, Journal of Applied Physics, American Institute of Physics, J. Appl. Phys., vol. 103, 124514, published Jun. 27, 2008.
"Resonant Tunneling Diodes for Sub-Terahertz and Terahertz Oscillators", by Masahiro Asada et al., Japanese Journal of Applied Physics, Jpn. J. Appl. Phys., vol. 47, No. 6, published Jun. 13, 2008, pp. 4375-4384.
Korean Office Action issued Jun. 14, 2025 during prosecution of related Korean patent application No. 10-2023-0045760. (English translation included).

\* cited by examiner

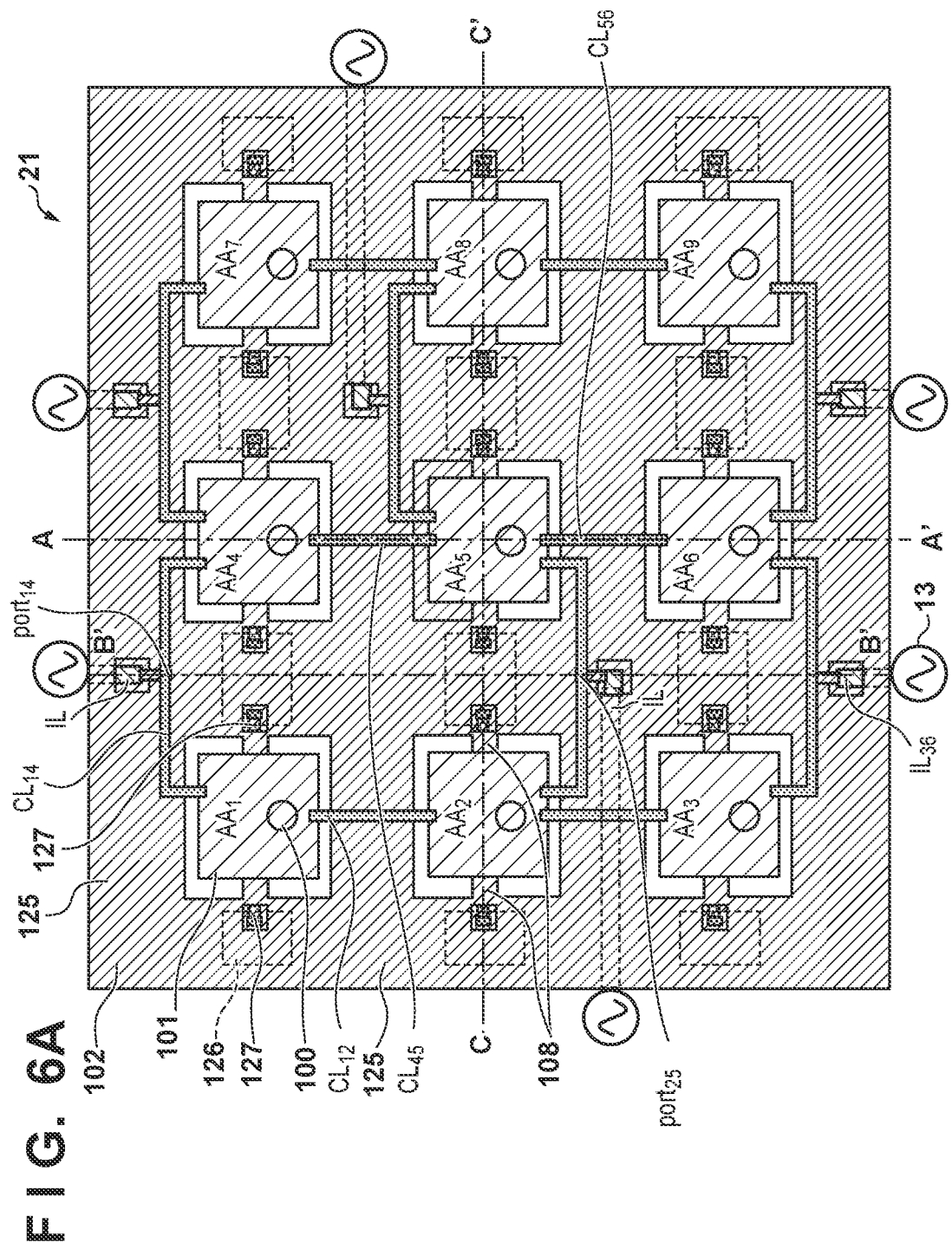

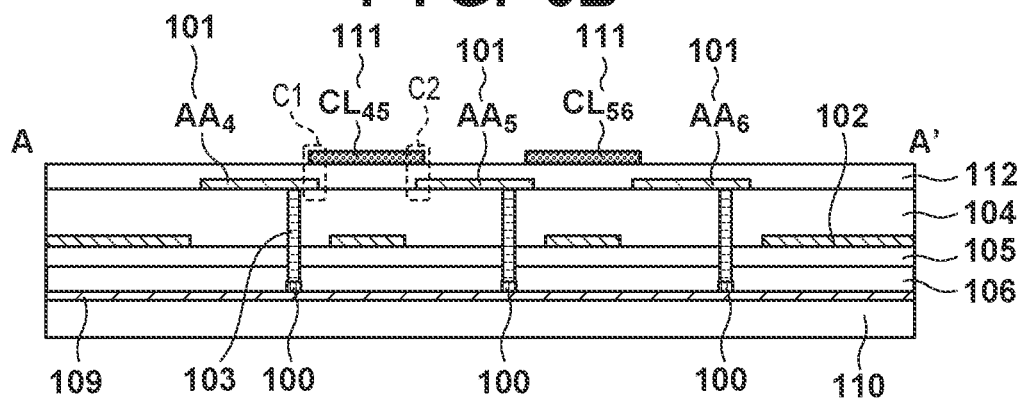
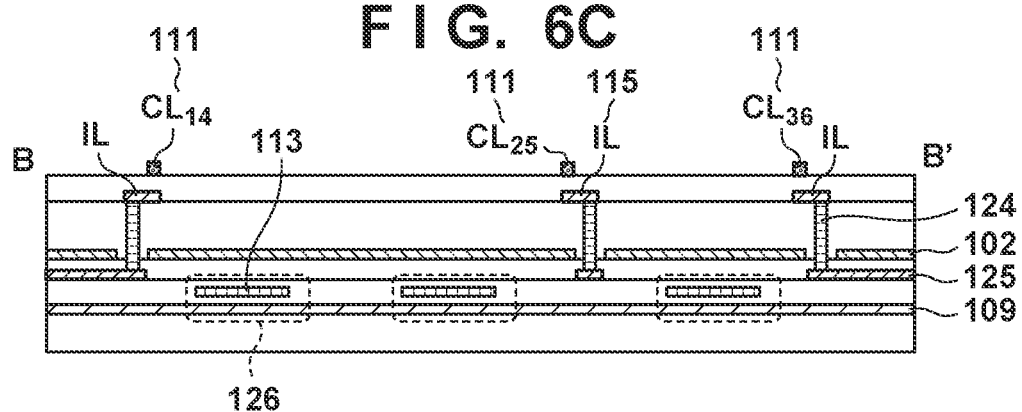
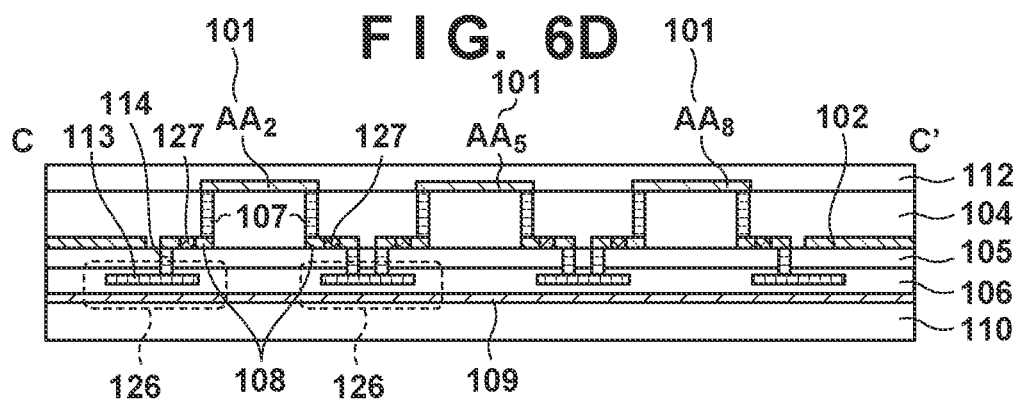

ANTENNA APPARATUS, COMMUNICATION APPARATUS, AND IMAGE CAPTURING SYSTEM

BACKGROUND OF THE INVENTION

Field of the Invention

The present invention relates to an antenna apparatus that outputs or detects an electromagnetic wave.

Description of the Related Art

As a current injection light source that generates an electromagnetic wave such as a terahertz wave, there is known an oscillator formed by integrating a resonator and an element having an electromagnetic wave gain with respect to a terahertz wave. Among these, an oscillator formed by integrating a Resonance Tunneling Diode (RTD) and an antenna is expected as an element that operates at room temperature in a frequency domain around 1 THz. Japanese Patent Laid-Open No. 2014-200065 discloses a terahertz-wave antenna array in which a plurality of active antennas each formed by integrating an RTD oscillator and an antenna are arranged on the same substrate. In the antenna array disclosed in Japanese Patent Laid-Open No. 2014-200065, coupling lines that mutually couple the plurality of active antennas are used to cause the plurality of active antennas to oscillate in the same phase in synchronism with each other.

SUMMARY OF THE INVENTION

The present invention provides a technique of improving the performance of an antenna apparatus by reducing the phase noise of an oscillator.

According to a certain aspect of the invention, there is provided an antenna apparatus comprising: an active antenna including an antenna, a semiconductor structure configured to operate as an oscillator, and at least two power lines configured to give a potential difference to the semiconductor structure, and configured to generate or detect an electromagnetic wave; and a control line electrically connected to one of the at least two power lines and configured to be injected with a signal for controlling a phase of the oscillator in the active antenna.

Further features of the present invention will become apparent from the following description of exemplary embodiments with reference to the attached drawings.

BRIEF DESCRIPTION OF THE DRAWINGS

FIG. 6A is a plan view of the second example of an antenna array;

FIGS. 6B to 6D are sectional views of the second example of the antenna array;

DESCRIPTION OF THE EMBODIMENTS

Figure 1A:
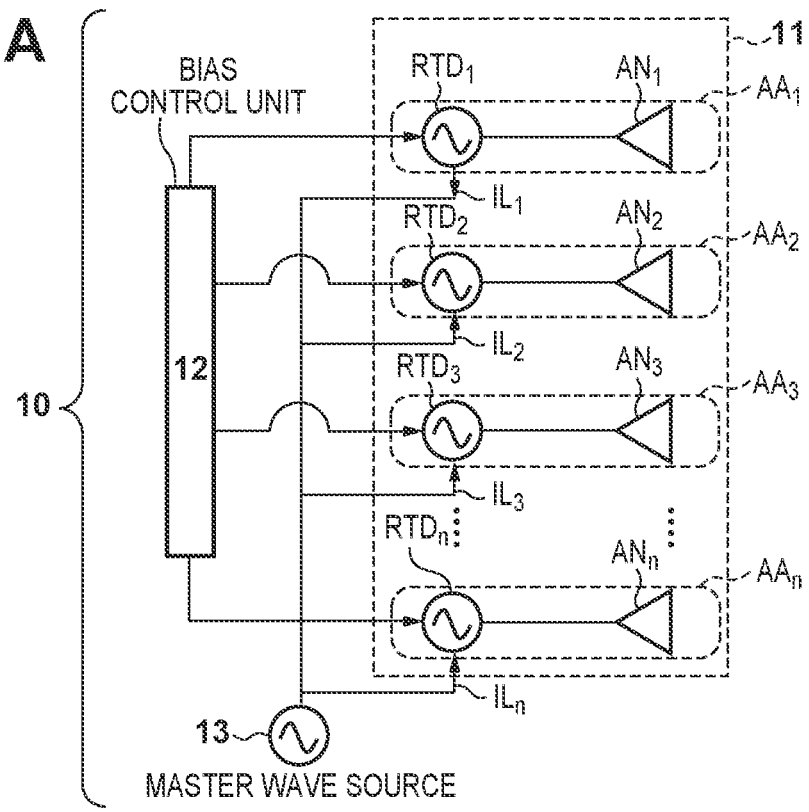
FIG. 1A is a block diagram showing an antenna apparatus 10.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

The arrangement of an antenna apparatus 10 applicable to a terahertz wave according to this embodiment will be described with reference to FIGS. 1A to 1C, 2A to 2D, 4A to 4C, and 5A to 5E. Note that a case in which the antenna apparatus 10 is used as a transmitter will particularly be described below but the antenna apparatus 10 can also be used as a receiver. A terahertz wave indicates an electromagnetic wave within a frequency range of 10 GHz (inclusive) to 100 THz (inclusive), and indicates, in an example, an electromagnetic wave within a frequency range of 30 GHz (inclusive) to 30 THz (inclusive).

Figure 1B:
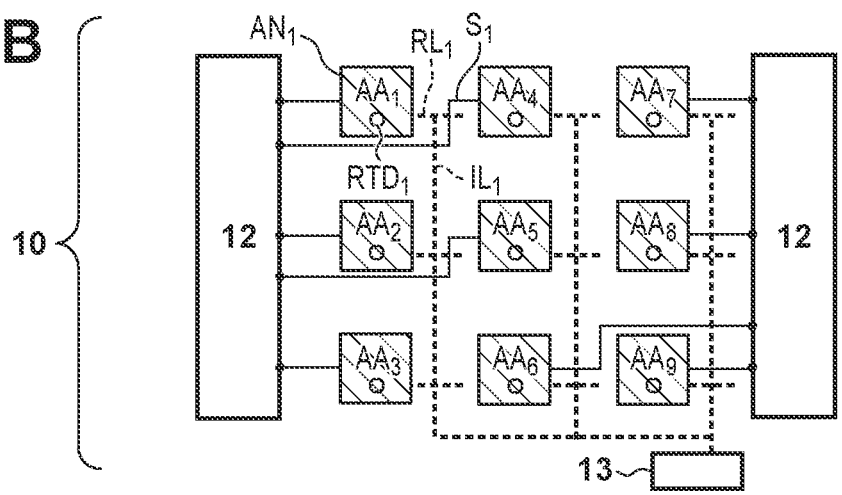
FIG. 1B is a schematic plan view showing an example of the arrangement of the antenna apparatus 10.

FIG. 1A is a block diagram for explaining an example of the system configuration of the antenna apparatus 10, and FIG. 1B is a schematic plan view of the antenna apparatus 10 when viewed from above in an example. The antenna apparatus 10 includes an antenna array 11 formed from n active antennas $AA_1$ to $AA_n$ arranged in an array, a bias control unit 12, and a master wave source (to be sometimes referred to as a "master oscillator 13" hereinafter). Note that the bias control unit 12 and the master oscillator 13 may be provided outside the antenna array 11. The active antenna $AA_1$ is formed by integrating at least one antenna $AN_1$ and a semiconductor $RTD_1$ as an oscillation source, and is configured to emit a terahertz wave TW of an oscillation frequency $f_{THz}$. Note that in the active antenna $AA_1$, components other than the semiconductor $RTD_1$ as an oscillation member may be interpreted as the antenna $AN_1$, and for example, only an antenna conductor or a combination of an antenna conductor and a ground (GND) conductor may be interpreted as the antenna $AN_1$. The same applies to the remaining active antennas $AA_2$ to $AA_n$. As shown in FIG. 1B, as an example of the antenna AN, a rectangular patch antenna can be used. However, this is merely an example, and an antenna having a shape other than the rectangular patch antenna may be used as long as it is possible to output an electromagnetic wave in a predetermined frequency band such as a terahertz frequency band. Note that FIG. 1B shows an example of the arrangement in which nine patch antennas are arrayed in a 3×3 matrix. The 3×3 matrix indicates an arrangement in which antennas are arrayed in 3 rows×3 columns. Each of semiconductors $RTD_1$ to $RTD_n$ of the active antennas includes a semiconductor structure for generating or detecting a terahertz wave. This embodiment will describe an example of using a Resonant Tunneling Diode (RTD) as the semiconductor structure. Note that a semiconductor having nonlinearity of carriers (nonlinearity of a current along with a voltage change in the current-voltage characteristic) or an electromagnetic wave gain with respect to a terahertz wave suffices for the semiconductor structure, and the semiconductor structure is not limited to the RTD. Therefore, each of the semiconductors $RTD_1$ to $RTD_n$ will be sometimes referred to as a semiconductor layer 100 hereinafter. The bias control unit 12 is a power supply for controlling a bias signal to be applied to each of the semiconductors $RTD_1$ to $RTD_n$, and is electrically connected to each of the semiconductors $RTD_1$ to $RTD_n$. The master oscillator 13 is also configured to apply a bias signal to each of the semiconductors $RTD_1$ to $RTD_n$. That is, there exist at least two power lines for supplying power to the semiconductors $RTD_1$ to $RTD_n$. One of the at least two power lines is a line for supplying power to the semiconductor at a frequency up to about 10 GHz, and is implemented by a microstrip line or a coplanar line. The other of the power lines is a line injected with a master signal of a 10-GHz wave to a terahertz wave generated by the master oscillator 13. The semiconductor RTD is connected to a ground conductor or the like, and the ground conductor can be regarded as a power line for giving a potential difference to the semiconductor RTD. A wiring other than those lines may be used as a power line for giving a potential difference to the semiconductor RTD. For example, the semiconductor RTD may be connected to the ground conductor and also to two or more power lines for giving different potential differences, and may have a structure in which one of the two or more power lines is turned on and the remaining power lines are turned off. That is, the number of power lines connected to the semiconductor RTD and the form of them are not limited.

Figure 4A:
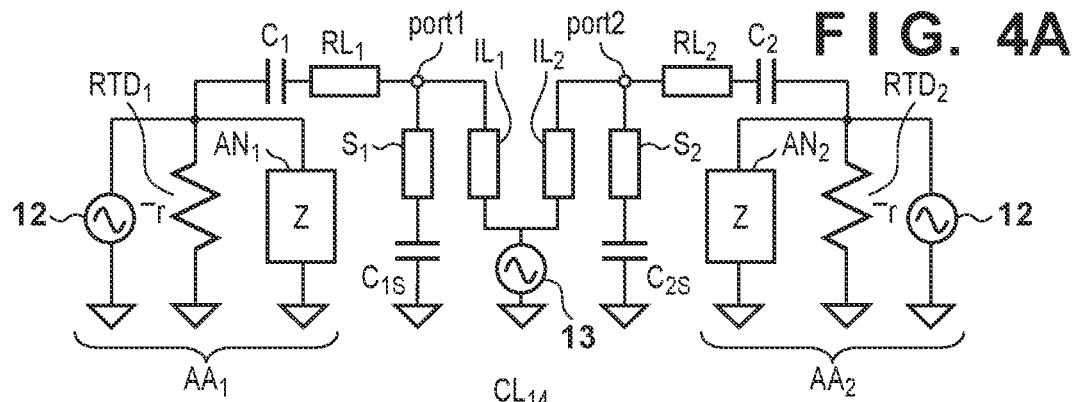
FIGS. 4A to 4C are circuit diagrams each for explaining a master oscillator.

FIG. 4A is a circuit diagram for explaining the master oscillator 13 that is connected to the active antennas $AA_1$ and $AA_2$ and injects a master signal. Note that the remaining active antennas $AA_3$ to $AA_9$ have the same arrangement. The active antenna $AA_1$ is an oscillator in which a negative resistance −r of the semiconductor $RTD_1$ and an impedance Z of the antenna $AN_1$ are connected in parallel. The impedance Z includes a resistance component and an LC component caused by the structure of the antenna $AN_1$. In addition, the bias control unit 12 for supplying a bias signal to the semiconductor $RTD_1$ is connected in parallel with the semiconductor $RTD_1$ via the power line. The active antenna $AA_2$ also has the same arrangement. The bias control unit 12 supplies a current necessary to drive the semiconductors $RTD_1$ and $RTD_2$, and adjusts the bias signal applied to the semiconductors $RTD_1$ and $RTD_2$. If the RTD is used as the oscillator, the bias signal is selected from a voltage in the negative differential resistance region of the RTD.

The master oscillator 13 is a wave source for synchronizing the timing of a terahertz wave, and outputs an electric signal of a subharmonic frequency which is ½N (N is a natural number) of the oscillation frequency $f_{THz}$ of the terahertz wave. That is, the master oscillator 13 outputs a signal of a low frequency which is 1/even number of the oscillation frequency of the oscillator in the active antenna in accordance with the bias signal given by the bias control unit 12.

The relationship between the master oscillator 13 and the oscillator (semiconductor RTD) of the active antenna is such that the master oscillator 13 serves as a master and the active antenna severs as a slave. That is, the active antenna operates by following a signal waveform output by the master oscillator 13. The master oscillator 13 outputs a signal with power larger than that of the output from the single active antenna serving as a slave. In an example, power injected from the master oscillator 13 into each RTD can be set to be equal to or higher than $P_{RTD}((3/16)\cos(\omega\tau)\cdot\Delta I\Delta V)$ as the power of the output signal of one RTD. In an example, power injected from the master oscillator 13 into each RTD can be set to power equal to or more than 10 times the power of the output signal of one RTD. In this case, $P_{RTD}$ represents an output from one RTD, ω represents the angular frequency of an electric signal output from the RTD, and τ represents a carrier traveling time in the semiconductor layer (RTD). Furthermore, ΔI and ΔV represent the current difference and the voltage difference between a current valley and a current peak in the negative resistance region of the RTD, respectively. For example, referring to FIG. 4A, if the master oscillator 13 injects the master signal to each of the two active antennas $AA_1$ and $AA_2$, power of $P_{RTD}((3/16)\cos(\omega\tau)\cdot\Delta I\Delta V)$ or more can be input to each of $RTD_1$ and $RTD_2$. Therefore, if the master oscillator 13 injects power to each of the two RTDs, it can output power obtained by adding, to power of $2\cdot P_{RTD}((3/16)\cos(\omega\tau)\cdot\Delta I\Delta V)$ or more, power of a transmission loss from the master oscillator 13 to each RTD. Note that in an example, the length of a path, to each RTD, of the master signal output from the master oscillator 13 can be configured to be a length of 20 times the wavelength of the master oscillator 13 or less. By setting such restriction, it is possible to make the master signal reach the RTD with sufficient power.

The master oscillator 13 is connected to the semiconductor $RTD_1$ of the active antenna $AA_1$ via a capacitor $C_1$ through control lines $IL_1$ and $RL_1$, and injects the master signal. A stub $S_1$ is connected to a port 1 between the control lines $IL_1$ and $RL_1$, and is grounded to ground (GND) via a capacitor $C_{1S}$ to be a short stub. The capacitor $C_{1S}$ can be designed to be a low impedance in the frequency band (for example, the terahertz band) of the electric signal output from the active antenna. Note that the oscillation frequency of the oscillator in the active antenna is in the terahertz band, and the electric signal output from the active antenna is a terahertz wave signal. That is, terms "terahertz band" and "terahertz wave" to be used below indicate the oscillation frequency of the oscillator in the active antenna and the electromagnetic wave of the frequency, respectively. Note that the terahertz wave is an example of an electromagnetic wave, and the following discussion can be applied to an antenna apparatus of a frequency band other than the terahertz band. The capacitor $C_{1S}$ is designed to have about 0.01 to 0.1 pF at 0.5 THz. Furthermore, the stub $S_1$ can be set to have a length of ¼ of the wavelength of the terahertz wave of the frequency $f_{THz}$. According to this, the terahertz wave is open at the port 1. Therefore, it is possible to inject the master signal into the semiconductor $RTD_1$ without influencing the terahertz wave by the control line $IL_1$. Furthermore, the control line $RL_1$ is set to have a length of ¼ of the wavelength of the terahertz wave, and thus the terahertz wave is open at the port 1. Therefore, the control line $RL_1$ functions as the resonator of the semiconductor $RTD_1$ together with the antenna AN. Note that the stub $S_1$ may be omitted.

Figure 1C:
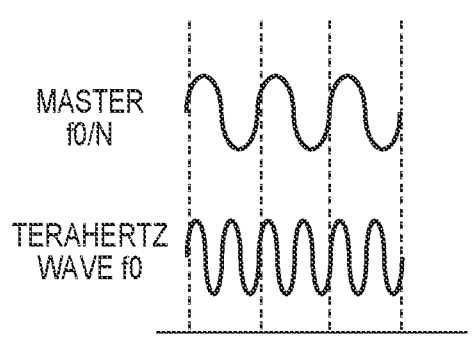
FIG. 1C is a schematic view showing the behavior of an injection locking phenomenon.

The semiconductor $RTD_1$ of the active antenna $AA_1$ is synchronized with a timing according to the injected master signal. For example, as shown in FIG. 1C, while the semiconductor $RTD_1$ outputs the terahertz wave, the timing at which the amplitude of the terahertz wave becomes 0 matches the master signal. The same applies to the active antenna $AA_2$. If the active antennas $AA_1$ and $AA_2$ are synchronized with each other, the capacitor $C_1$ and a capacitor $C_2$ have the same structure, and the difference in electrical length between the control line $IL_1$ and a control line $IL_2$ is set to an integer multiple of the wavelength of the master oscillator 13. Thus, since the timing at which the amplitude of the master signal becomes 0 is the same with respect to the respective active antennas, synchronization between these active antennas can be established. Note that in an example, the capacitors $C_1$ and $C_2$ have a value of about 1 fF to several tens of pF which is about ⅒ to 10 times the negative resistance of the semiconductor RTD.

Figure 2A:
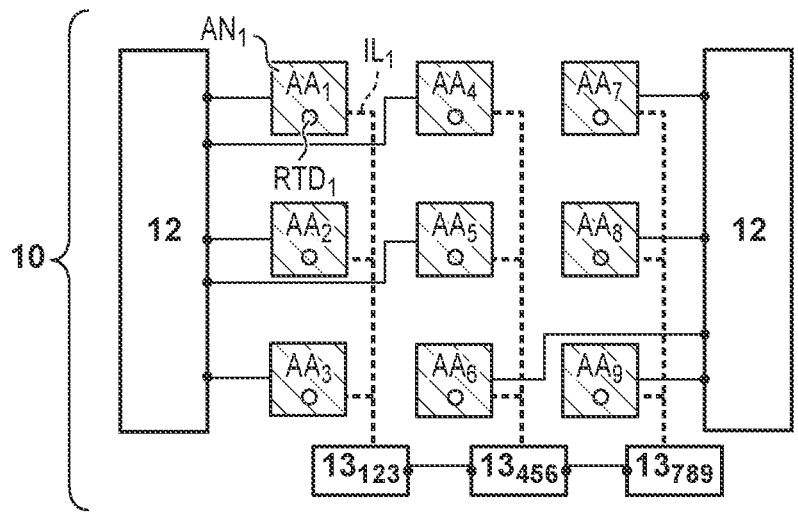
FIG. 2A is a view showing an example of a 3×3 antenna array.
Figure 2B:
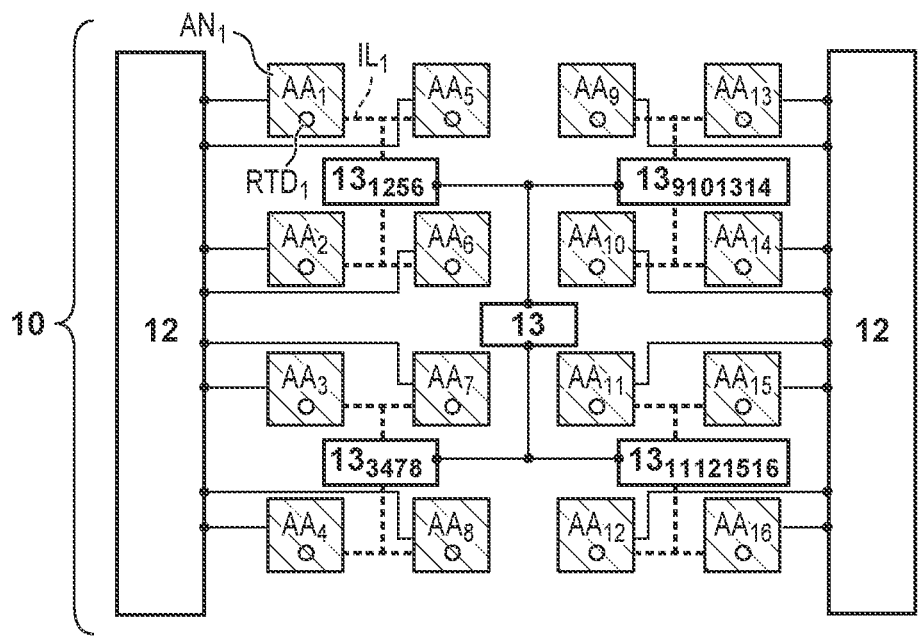
FIG. 2B is a view showing an example of a 4×4 antenna array.

FIGS. 1A, 1, and 4A show an example in which the antenna apparatus 10 includes only one master oscillator 13. The number of master oscillators 13 is not limited to one. For example, as shown in FIGS. 2A and 2B, the antenna apparatus 10 may include a plurality of master oscillators 13 that are synchronized with each other. A subharmonic frequency $f_{sub}$ as the frequency of the master oscillator 13 is lower than the frequency $f_{THz}$ of the terahertz wave. An oscillator of a frequency lower than that of the terahertz wave can increase the phase accuracy. Therefore, by using, as the master oscillator 13, an oscillator of a relatively low frequency that can increase the phase accuracy, the terahertz waves can be synchronized accurately. As the master oscillator 13, for example, an oscillator obtained by accurately stabilizing a transistor oscillator in the millimeter wave band by a Phase Locked Loop (PLL) can be used. In an example, the master oscillator 13 is formed using a semiconductor heterostructure, a semiconductor stacked structure, a resonant tunneling diode, and a negative resistance diode.

As shown in FIG. 2A, when the plurality of master oscillators 13 are electrically connected by control lines, synchronization among the master oscillators 13 can be established. Referring to FIG. 2A, three master oscillators 13 are provided. Each of these master oscillators 13 distributes the master signal to three active antennas arranged in different columns among the plurality of active antennas arranged in a matrix. Note that a subscript added to reference numeral "13" denoting the master oscillator is used to designate the active antennas to which the master oscillator 13 supplies the master signal. For example, the master oscillator $13_{123}$ supplies the master signal to the active antennas $AA_1$ to $AA_3$. Similarly, the master oscillator $13_{456}$ supplies the master signal to the active antennas $AA_4$ to $AA_6$, and the master oscillator $13_{789}$ supplies the master signal to the active antennas $AA_7$ to $AA_9$. The same applies to other drawings. The electrical length of each control line IL is set so that the distributed master signal has the same phase at a position where it is injected into the semiconductor RTD included in each of the plurality of active antennas AA. Note that FIG. 2A shows an example in which one master oscillator 13 supplies the master signal to the vertically arranged active antennas among the active antennas arrayed in the matrix. The present invention, however, is not limited to this. For example, an arrangement such that one master oscillator 13 supplies the master signal to the horizontally arranged active antennas may be used.

FIG. 2B shows an example when active antennas are arrayed in a 4×4 matrix. In the example shown in FIG. 2B, each of four master oscillators $13_{1256}$, $13_{3478}$, $13_{9101314}$ and $13_{11121516}$ supplies a master signal to corresponding four active antennas. Note that the four master oscillators are electrically connected, via control lines, to, for example, the master oscillator 13 that supplies a reference master signal, and configured to be synchronized with each other. Note that the master oscillator 13 at the center of FIG. 2B may be omitted, and an arrangement in which the four master oscillators are electrically connected via control lines to be synchronized with each other may be used. In an example, each master oscillator can be arranged so that the distances to the four active antennas as the supply destinations of the master signal are equal to each other. That is, each master oscillator can be configured to inject the master signal, distributed to the respective active antennas, into the semiconductors RTD in the same phase with equal power.

Figure 2C:
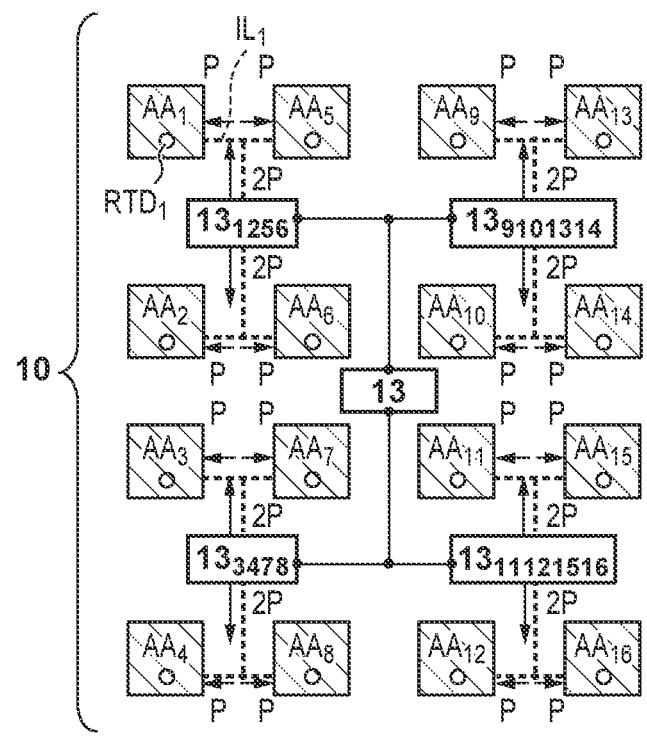
FIG. 2C is a view for explaining distribution of power.

An example in which the master signal is injected into the semiconductor RTD of each active antenna AA with power P will now be described with reference to FIG. 2C. Note that FIG. 2C is a view showing an arrangement obtained by removing the bias control unit 12 from FIG. 2B, for the sake of descriptive convenience. As shown in FIG. 2C, for example, the master oscillator $13_{1256}$ supplies the master signal to the active antennas $AA_1$, $AA_2$, $AA_5$, and $AA_6$. At this time, for example, the master oscillator $13_{1256}$ outputs the master signal to the active antennas $AA_1$ and $AA_5$ via a common first control line, and then the master signal is equally distributed to the active antennas $AA_1$ and $AA_5$ via a branch path. Furthermore, for example, the master oscillator $13_{1256}$ can output the master signal to the active antennas $AA_2$ and $AA_6$ via a second control line different from the first control line. After that, the master signal is equally distributed to the active antennas $AA_2$ and $AA_6$ via a branch path. At this time, the master oscillator $13_{1256}$ outputs the master signal to each of the first and second control lines with power of 2·P, thereby making it possible to supply the master signal of the power P to each of the active antennas $AA_1$, $AA_2$, $AA_5$, and $AA_6$. The electrical length of each control line IL is set so that the master signal has the same phase at the position of the semiconductor RTD of each active antenna injected with the master signal. Note that the design such that the master signal with equal power is supplied at the position of the semiconductor RTD of each active antenna has been described but it is possible to synchronize the active antennas even if the master signal has no equal power.

Figure 2D:
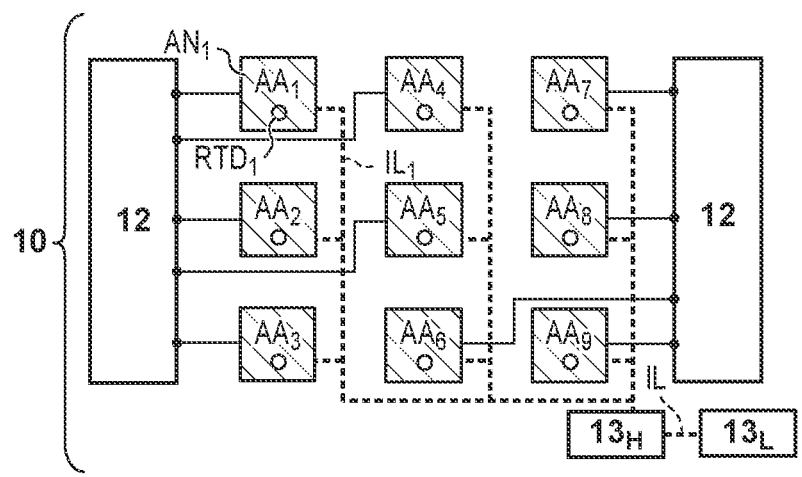
FIG. 2D is a view showing an example of a 3×3 antenna array.

In the above example, a case in which the plurality of master oscillators each for supplying the master signal to the active antennas are used has been explained but the present invention is not limited to this. For example, as shown in FIG. 2D, while a plurality of master oscillators 13 are provided, only some (one in the example shown in FIG. 2D) of the master oscillators 13 may supply the master signal to the active antennas. For example, the example of FIG. 2D shows an arrangement in which two master oscillators $13_L$ and $13_H$ are provided. In an example, the frequency of the master oscillator $13_L$ is lower than that of the master oscillator $13_H$ that supplies the master signal to the active antennas. In this arrangement, for example, a high accuracy signal source using a Phase Locked Loop (PLL) in the millimeter wave or microwave region can be used as the master oscillator $13_L$. Therefore, it is possible to improve the phase accuracy of the master oscillator $13_H$ that outputs a master signal of a relatively high frequency, and implement an oscillator with low phase noise in the terahertz band.

Implementation Example

Figure 5A:
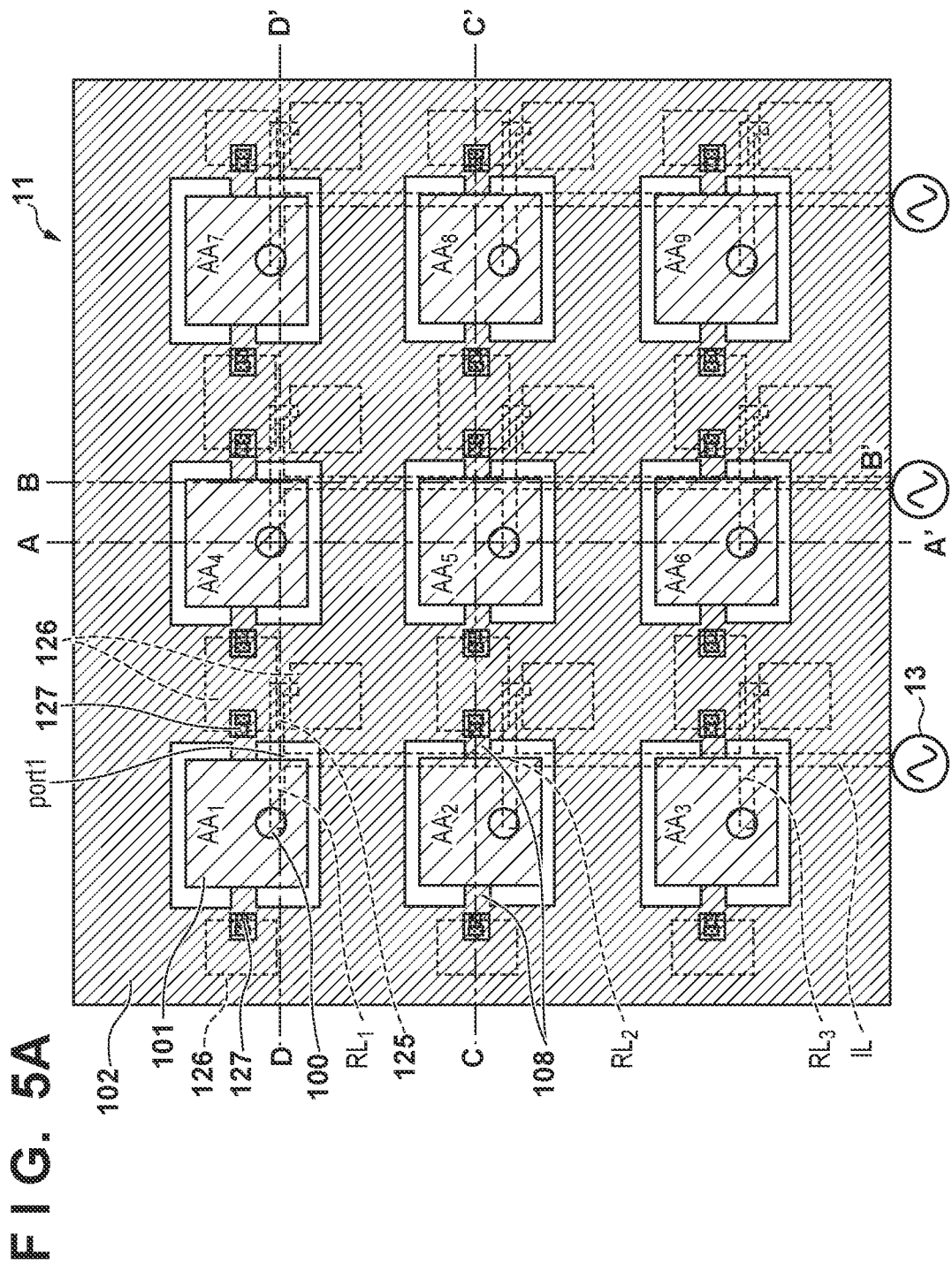
FIG. 5A is a plan view of the first example of an antenna array.

Subsequently, the structure and arrangement of the above-described antenna apparatus 10 will be described with reference to FIGS. 5A to 5E. FIG. 5A is a schematic plan view of the antenna array 11 in which the nine active antennas $AA_1$ to $AA_9$ are arranged in a 3×3 matrix. FIGS. 5B to 5E are sectional views of the antenna array 11 taken along lines A-A', B-B', C-C', and D-D' in FIG. 5A, respectively. The antenna array 11 is an element that oscillates or detects the terahertz wave of the frequency $f_{THz}$, and is made of a semiconductor material. In this embodiment, as the antenna array 11, an antenna array in which the nine active antennas $AA_1$ to $AA_9$ are arranged in a 3×3 matrix will be exemplified but the present invention is not limited to this. For example, the active antennas may linearly be arranged or may be arranged in another form. In addition, the number of active antennas is not limited to nine, and even if the active antennas are arranged in a matrix, they may be arranged in a matrix other than the 3×3 matrix. Note that each of the active antennas $AA_1$ to $AA_9$ serves as a resonator that causes the terahertz wave to resonate and a radiator that transmits or receives the terahertz wave. In the antenna array 11, the active antennas can be arranged at a pitch (interval) equal to or smaller than the wavelength of the detected or generated terahertz wave or a pitch (interval) of an integer multiple of the wavelength. Note that in the following description, to more generalize the semiconductor RTD as the semiconductor structure for generating or detecting the terahertz wave, the semiconductor RTD will be described as the semiconductor layer 100. In addition to the above-described semiconductor structure, the semiconductor layer 100 may include an electrode for ohmic contact with the semiconductor structure or an electrode layer for connection to upper and lower wiring layers.

Note that the respective active antennas $AA_1$ to $AA_9$ have the same arrangement. Therefore, if it is unnecessary to particularly discriminate the active antennas $AA_1$ to $AA_9$, the term "active antenna AA" is collectively used. That is, the arrangement of the "active antenna AA" to be described below is applied to each of the active antennas $AA_1$ to $AA_9$ forming the antenna array 11.

(Active Antenna)

As shown in FIGS. 5B to 5E, the active antenna AA includes a substrate 110, a conductor layer 109, a conductor layer 101, and dielectric layers 104 to 106. Note that as shown in FIGS. 5B to 5E, the substrate 110, the conductor layer 109, and the conductor layer 101 are stacked in this order, and the dielectric layers 104 to 106 are located between the two conductor layers 109 and 101 (wiring layers). Note that the dielectric layers 104 to 106 are arranged in the order of the dielectric layer 106, the dielectric layer 105, and the dielectric layer 104 from the side of the conductor layer 109. The arrangement of the antenna shown in FIGS. 5B to 5E is called a microstrip antenna using a microstrip line having a finite length. An example of using a patch antenna as a microstrip resonator will now be described. The conductor layer 101 is the patch conductor of the active antenna AA (the upper conductor of the patch antenna) arranged to face the conductor layer 109 via the dielectric layers 104 to 106. The conductor layer 109 serves as an electrically grounded ground conductor (GND conductor), and also serves as a reflector layer. The active antenna AA is set to operate as a resonator in which the width of the conductor layer 101 in the A-A' direction (resonant direction) is $\lambda_{THz}/2$. Note that $\lambda_{THz}$ represents an effective wavelength, in the dielectric layers 104 to 106, of the terahertz wave that resonates in the active antenna AA. If $\lambda_0$ represents the wavelength of the terahertz wave in a vacuum, and $\varepsilon_r$ represents the effective relative permittivity of the dielectric layer 104, $\lambda_{THz}=\lambda_0 \times \varepsilon_r^{-1/2}$ is obtained.

The active antenna AA has the semiconductor structure as the semiconductor layer 100. The semiconductor layer 100 corresponds to each of the semiconductors $RTD_1$ to $RTD_9$ in FIG. 1A, and is a Resonant Tunneling Diode (RTD) in this embodiment, as described above. The RTD is a typical semiconductor structure having an electromagnetic wave gain in the frequency band of the terahertz wave, and is also called an active layer. Therefore, the semiconductor layer 100 will be sometimes referred to as the "RTD" hereinafter. The RTD has a resonant tunneling structure layer including a plurality of tunneling barrier layers in which a quantum well layer is provided between the plurality of tunneling barrier layers, and has a multiquantum well structure for generating a terahertz wave by inter-subband carrier transition. The RTD has an electromagnetic wave gain in the frequency domain of the terahertz wave based on a photon-assisted tunneling phenomenon in the negative differential resistance region of the current-voltage characteristic, and performs self-oscillation in the negative differential resistance region.

The semiconductor layer 100 is electrically connected to the conductor layer 101. The semiconductor structure is, for example, a mesa structure, and the semiconductor layer 100 includes an electrode (ohmic or Schottky electrode) for contact with the semiconductor structure and an electrode layer for connection to the upper and lower wiring layers. The semiconductor layer 100 is located in the active antenna AA, and is configured to oscillate or detect the terahertz wave. The semiconductor layer 100 is formed from a semiconductor layer having nonlinearity or an electromagnetic wave gain with respect to the terahertz wave.

The active antenna AA is an active antenna formed by integrating the semiconductor layer 100 and the patch antenna (antenna AN). The frequency $f_{THz}$ of the terahertz wave oscillated from the single active antenna AA is decided based on the resonance frequency of a fully-parallel resonant circuit obtained by combining the patch antenna and the reactance of the semiconductor layer 100. More specifically, with respect to a resonant circuit obtained by combining the admittances (YRTD and Yaa) of an RTD and an antenna from the equivalent circuit of the oscillator described in Jpn. J. Appl. Phys., Vol. 47, No. 6 (2008), pp. 4375-4384, a frequency satisfying an amplitude condition given by expression (1) and a phase condition given by equation (2) is decided as the oscillation frequency $f_{THz}$.

$$\mathrm{Re}[YRTD]+\mathrm{Re}[Y11]\leq 0 \quad (1)$$

$$\mathrm{Im}[YRTD]+\mathrm{Im}[Y11]=0 \quad (2)$$

where YRTD represents the admittance of the semiconductor layer 100, Re represents a real part, and Im represents an imaginary part. Since the semiconductor layer 100 includes the RTD as a negative resistance element, Re[YRTD] has a negative value. Y11 represents the admittance of the whole structure of the active antenna $AA_1$ when viewed from the semiconductor layer 100.

Note that as the semiconductor layer 100, a Quantum Cascade Laser (QCL) having a semiconductor multilayer structure of several hundred to several thousand layers may be used. In this case, the semiconductor layer 100 is a semiconductor layer including the QCL structure. As the semiconductor layer 100, a negative resistance element such as a Gunn diode or IMPATT diode often used in the millimeter wave band may be used. As the semiconductor layer 100, a high frequency element such as a transistor with one terminal terminated may be used, and a heterojunction bipolar transistor (HBT), a compound semiconductor field effect transistor (a compound semiconductor FET), a high electron mobility transistor (HEMT), or the like can be used as the transistor. As the semiconductor layer 100, a negative differential resistance of the Josephson device using a superconductor layer may be used. That is, the semiconductor layer 100 need not be the RTD as long as it has the semiconductor structure for generating or detecting an electromagnetic wave in a predetermined frequency band, and an arbitrary structure having the same characteristic may be used. In this example, the RTD is used as a component suitable for the terahertz wave, but an antenna array corresponding to an electromagnetic wave in an arbitrary frequency band may be implemented by an arrangement described in this embodiment. That is, the semiconductor layer 100 according to this embodiment is not limited to the RTD that outputs the terahertz wave, and can be formed using a semiconductor that can output an electromagnetic wave in an arbitrary frequency band.

If the microstrip resonator such as a patch antenna has a thick dielectric layer, a conductor loss is reduced and the radiation efficiency is improved. It is required for the dielectric layers 104 to 106 that a thick film can be formed (typically, 3 μm or more), a low loss/low dielectric constant is obtained in the terahertz band, and fine processability is high (planarization or etching). As the thickness of the dielectric layer is larger, the radiation efficiency is higher, but if the thickness is too large, multi-mode resonance may occur. Therefore, the thickness of the dielectric layer can be designed within a range whose upper limit is 1/10 of the oscillation wavelength. On the other hand, to implement the high frequency and high output of the oscillator, micronization and high current density of the diode need to be implemented. To do this, the dielectric layer is also required to suppress a leakage current and take measures against migration as the insulating structure of the diode. To satisfy the above two requirements, dielectric layers of different materials may be used as the dielectric layers 104 to 106.

As the material of the dielectric layer 104, an organic dielectric material such as benzocyclobutene (BCB of the Dow Chemical Company, $\varepsilon_{r1}=2$), polytetrafluoroethylene, or polyimide can be used. In this example, $\varepsilon_{r1}$ represents the relative permittivity of the first dielectric layer 104. A TEOS oxide film that can form a relatively thick film and has a low dielectric constant or an inorganic dielectric material such as spin-on-glass may be used for the first dielectric layer 104. The dielectric layers 105 and 106 are required to have an insulation property (the property of behaving as an insulator or high resistor that does not conduct electricity with respect to a DC voltage), a barrier property (the property of preventing spread of a metal material used for an electrode), and processability (processibility with sub-micron accuracy). As a material satisfying these properties, for example, an inorganic insulator material such as silicon oxide ($\varepsilon_{r2}=4$), silicon nitride ($\varepsilon_{r2}=7$), aluminum oxide, or aluminum nitride is used. $\varepsilon_{r2}$ represents the relative permittivity of the dielectric layers 105 and 106.

As in this embodiment, if the dielectric layers 104 to 106 have a multilayer arrangement, the relative permittivity $\varepsilon_r$ of the dielectric layers 104 to 106 is the effective relative permittivity decided based on the thickness and relative permittivity $\varepsilon_{r1}$ of the dielectric layer 104 and the thickness and relative permittivity $\varepsilon_{r2}$ of the dielectric layers 105 and 106. To decrease the difference in dielectric constant between the antenna and air from the viewpoint of impedance matching between the antenna and a space, a material different from that of the dielectric layers 105 and 106 and having a low relative permittivity ($\varepsilon_{r1}<\varepsilon_{r2}$) can be used for the dielectric layer 104. Note that in the antenna apparatus 10, the dielectric layer need not have a multilayer arrangement, and may have a structure formed by a layer of one of the above-described materials.

The semiconductor layer 100 is arranged on the conductor layer 109 formed on the substrate 110. The semiconductor layer 100 and the conductor layer 109 are electrically connected to each other. Note that to reduce an ohmic loss, the semiconductor layer 100 and the conductor layer 109 can be connected with low resistance. The ohmic loss is, for example, a loss in a resistor. A via 103 is arranged on the opposite side of the side on which the conductor layer 109 is arranged with respect to the semiconductor layer 100, and is electrically connected to the semiconductor layer 100. The semiconductor layer 100 is embedded in the dielectric layer 106, and the dielectric layer 106 covers the periphery of the semiconductor layer 100.

The semiconductor layer 100 includes an ohmic electrode as a conductor that makes ohmic contact to the semiconductor to reduce RC delay and an ohmic loss caused by series resistance. As the material of the ohmic electrode, for example, Ti/Au, Ti/Pd/Au, Ti/Pt/Au, AuGe/Ni/Au, TiW, Mo, ErAs, or the like can be used. Note that this material is represented by chemical symbols, and a material represented by each chemical symbol will not be described in detail. The same applies to the following description. By decreasing the contact resistance using a semiconductor in which a region where the semiconductor contacts the ohmic electrode is doped with impurities at a high concentration, high output and a high frequency can be implemented. The semiconductor layer 100 can be configured to suppress a loss of an electromagnetic wave to 1% or less since the absolute value of the negative resistance indicating the magnitude of the gain of the RTD used in the terahertz wave band is on the order of about 1 (inclusive) to 100 (inclusive) Ω. Therefore, the contact resistance in the ohmic electrode can be suppressed to 1Ω or less as a guide. To operate in the terahertz wave band, the semiconductor layer 100 is formed to have a width of about 0.1 (inclusive) to 5 m (inclusive) as a typical value. Therefore, the contact resistance is suppressed within the range of 0.001Ω (inclusive) to several Ω (inclusive) by setting the resistivity to 10 Ω·μm² or less.

The semiconductor layer 100 may be configured to include a metal (Schottky electrode) that makes not ohmic contact but Schottky contact. In this case, the contact interface between the Schottky electrode and the semiconductor exhibits a rectifying property, and the active antenna AA can be used as a terahertz wave detector. Note that an arrangement using an ohmic electrode will be described below.

Figure 5B:
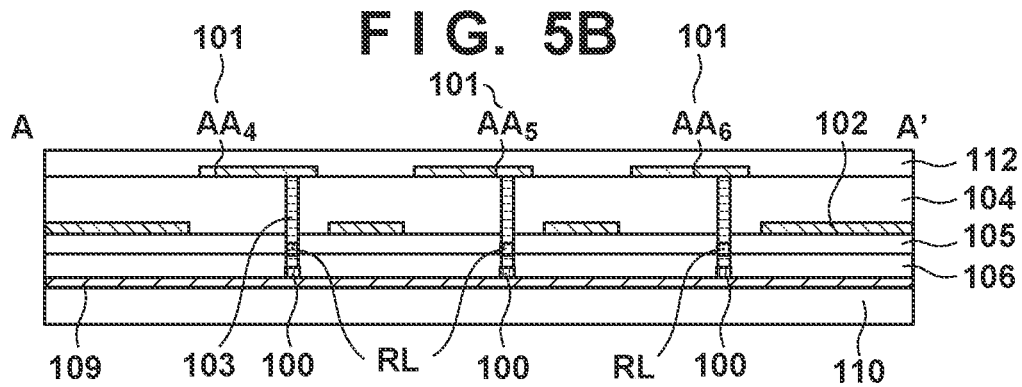
FIGS. 5B to 5E are sectional views of the first example of the antenna array.

As shown in FIG. 5B, the substrate 110, the conductor layer 109, the semiconductor layer 100, the via 103, and the conductor layer 101 are stacked in the active antenna AA in this order. The via 103 is formed in the dielectric layers 104 to 106, and the conductor layer 101 and the semiconductor layer 100 are electrically connected via the via 103. If the width of the via 103 is too large, the radiation efficiency deteriorates due to deterioration of the oscillation characteristic of the patch antenna and an increase in parasitic capacitance. Therefore, the width of the via 103 can be set to a width that does not interfere with a resonance electric field, typically, to 1/10 or less of the effective wavelength λ of the standing terahertz wave of the oscillation frequency $f_{THz}$ in the active antenna AA. The width of the via 103 may be small to the extent that series resistance is not increased, and can be reduced to about twice a skin depth as a guide. Considering that the series resistance is decreased to a value not exceeding 1Ω, the width of the via 103 typically falls within the range of 0.1 μm (inclusive) to 20 μm (inclusive), as a guide.

Figure 5C:
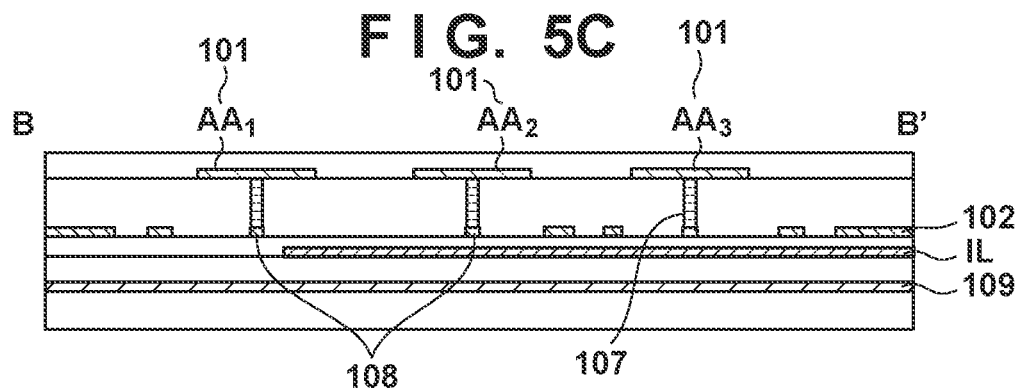

Referring to FIG. 5C, the conductor layer 101 is electrically connected to a wiring 108 via the via, and the wiring 108 is electrically connected to the bias control unit 12 via a bias wiring layer 102 as a common wiring formed in the chip. The bias control unit 12 can also be called a power circuit. The wiring layer 102 is arranged at an intermediate point between the dielectric layers 104 and 105. The wiring 108 is extracted from each antenna. The bias control unit 12 is a power supply for supplying a bias signal to the semiconductor layer 100 of the active antenna AA. Therefore, if the wiring layer 102 is connected to the wiring 108 extracted from each of adjacent antennas, the bias signal is supplied to the semiconductor layer 100 of each antenna. Since the bias wiring layer 102 is common, it is possible to ensure a sufficient wiring width. Thus, it is possible to reduce the variation of the operating voltage between the antennas caused by the variation of wiring resistance, and synchronization is stabilized even if the number of arrays increases. It is possible to obtain a symmetric structure around the antennas and thus the radiation pattern is not broken.

A via 107 that connects the conductor layer 101 and the wiring 108 is a connecting portion for electrically and mechanically connecting the wiring 108 to the conductor layer 101. A structure that electrically connects the upper and lower layers is called a via. In addition to the role as a member forming the patch antenna, the conductor layers 109 and 101 are connected to these vias to serve as an electrode for injecting a current into the RTD as the semiconductor layer 100. In this embodiment, as the via, a material having a resistivity of 1×10-6 Ω·m or less can be used. More specifically, as the material, a metal or a metal compound such as Ag, Au, Cu, W, Ni, Cr, Ti, Al, AuIn alloy, or TiN is used.

The width of the via 107 that connects the conductor layer 101 and the wiring 108 is smaller than that of the conductor layer 101. The width of the conductor layer 101 corresponds to the width in the electromagnetic wave resonance direction (that is, the A-A' direction) in the active antenna AA. The width of a portion (connecting portion) of the wiring 108 connected to the via 107 is smaller (thinner) than that of the conductor layer 101 (active antenna AA). These widths can be 1/10 or less (λ/10 or less) of the effective wavelength λ of the standing terahertz wave of the oscillation frequency $f_{THz}$ in the active antenna AA. This is because if the via 107 and the wiring 108 are arranged at positions with widths such that they do not interfere with a resonance electric field in the active antenna AA, the radiation efficiency can be improved.

The position of the via 107 can be arranged at the node of the electric field of the standing terahertz wave of the oscillation frequency $f_{THz}$ in the active antenna AA. At this time, the via 107 and the wiring 108 are configured so that the impedance is sufficiently higher than the absolute value of the negative differential resistance of the RTD as the semiconductor layer 100 in the frequency band around the oscillation frequency $f_{THz}$. In other words, the via 107 and the wiring 108 are connected to the active antenna AA so as to obtain a high impedance when viewed from the RTD at the oscillation frequency $f_{THz}$. In this case, the active antenna AA is isolated (separated) in a path via the bias wiring layer 102 at the frequency $f_{THz}$. Thus, a current of the oscillation frequency $f_{THz}$ induced by each active antenna does not influence the adjacent antenna via the wiring layer 102 and the bias control unit 12. In addition, interference between the standing electric field of the oscillation frequency $f_{THz}$ in the active antenna AA and these power supply members is suppressed.

Figure 5D:
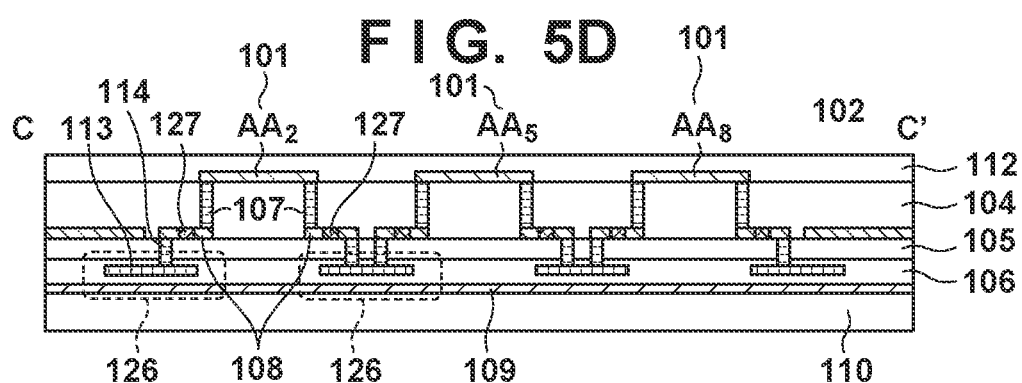

The bias wiring layer 102 is a bias wiring common to the plurality of active antennas AA. Note that the bias control unit 12 is arranged outside the chip to supply a bias signal to the semiconductor layer 100 of each antenna. The bias control unit 12 includes a stabilization circuit for suppressing a parasitic oscillation of a low frequency. The stabilization circuit is set to have an impedance lower than the absolute value of the negative resistance corresponding to the gain of the semiconductor layer 100 in a frequency band from DC to 10 GHz. To stabilize a relatively high frequency of 0.1 to 10 GHz, an AC short circuit is arranged, for each active antenna, by series-connecting a resistance layer 127 of TiW and a Metal-Insulator-Metal (MIM) capacitor 126, as shown in FIG. 5D. In this case, the MIM capacitor 126 has a large capacity within the above-described frequency range, and has a capacity of about several pF in an example. The MIM capacitor 126 of this embodiment uses a structure in which part of the dielectric layer 106 is sandwiched by a conductor layer 113 and the conductor layer 109 as GND.

Figure 5E:
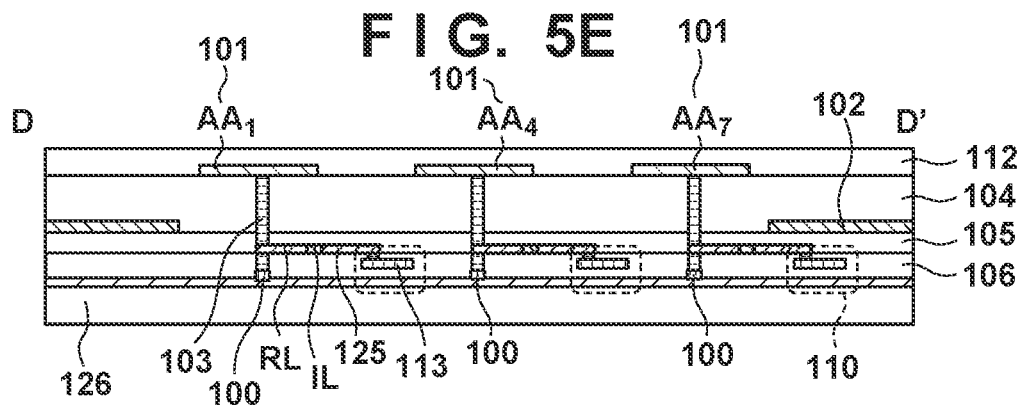

In this embodiment, by focusing on, for example, the active antenna $AA_1$, the master oscillator 13 injects the master signal into the port 1 via the control line IL, as shown in FIG. 5A. In the example shown in FIG. 5A, a stub 125 is configured to extend from the port 1 to the opposite side of the semiconductor layer 100. The stub 125 is set to have a length of ¼ of the wavelength of the terahertz wave, and is grounded via the MIM capacitor 126. The master signal injected into the port 1 is injected into the semiconductor RTD 100 via the control line RL extending to the opposite side of the stub 125. Note that the length of the control line RL is designed to be a length of ¼ of the wavelength of the terahertz wave so as to be the resonator of the semiconductor RTD. As shown in FIG. 5C, the control line IL is arranged between the dielectric layers 105 and 106 so as to inject the master signal into each active antenna. Furthermore, as shown in FIG. 5E, the stub 125 and the control line RL are also arranged between the dielectric layers 105 and 106, and the stub 125 and the control line RL are branched from the control line IL. Note that FIG. 5E separately shows the control line IL, the control line RL, and the stub 125 for the sake of descriptive convenience, but these components are a series of conductors, and are not always separated, unlike FIG. 5E. The stub 125 is connected to the conductor layer 113, and is grounded to the conductor layer 109 as GND via the MIM capacitor 126. As shown in FIGS. 5B and 5E, the control line RL is connected to the via 103 and is configured to inject the master signal into the semiconductor layer 100.

(Antenna Array)

The antenna array 11 shown in FIG. 5A has an arrangement in which the nine active antennas $AA_1$ to $AA_9$ are arranged in a 3×3 matrix, and each of these active antennas singly oscillates the terahertz wave of the frequency $f_{THz}$. Note that the number of active antennas is not limited to nine. For example, 16 active antennas may be arranged in a 4×4 matrix, or 15 active antennas may be arranged in a 3×5 matrix. At this time, as described above, each active antenna AA includes an oscillator like the semiconductor layer 100 including the RTD, and if the oscillators individually operate, the plurality of active antennas can output electromagnetic waves of different phases, respectively. In this case, the electromagnetic waves may weaken each other, and it can be expected not to sufficiently obtain the characteristics of the antennas. To the contrary, in this embodiment, by injecting the master signal, the phases of the oscillators in the respective active antennas can be accurately synchronized with each other, and it is thus possible to improve the gain of the antenna array.

(Practical Material and Structure Dimensions)

A practical example of the antenna array 11 will be described. The antenna array 11 is a semiconductor device that can perform single-mode oscillation in a frequency band of 0.45 to 0.50 THz. The substrate 110 is a semi-insulating InP substrate. The semiconductor layer 100 is formed from a multiquantum well structure by InGaAs/AlAs lattice-matched on the substrate 110, and an RTD having a double-barrier structure is used in this embodiment.

This is also called the semiconductor heterostructure of the RTD. As the current-voltage characteristic of the RTD used in this embodiment, the measurement value of the peak current density is 9 mA/μm$^2$, and the measurement value of the negative differential conductance per unit area is 10 mS/μm$^2$. The semiconductor layer 100 is formed in a mesa structure, and is formed from the semiconductor structure including the RTD, and an ohmic electrode for electrical connection to the semiconductor structure. The mesa structure has a circular shape with a diameter of 2 μm, and the magnitude of the negative differential resistance of the RTD at this time is about −30Ω per diode. In this case, it is estimated that the negative differential conductance of the semiconductor layer 100 including the RTD is about 30 mS and the diode capacity is about 10 fF.

The active antenna AA is a patch antenna having a structure in which the dielectric layers 104 to 106 are sandwiched by the conductor layer 101 as a patch conductor and the conductor layer 109 as a ground conductor. This patch antenna is a square patch antenna in which one side of the conductor layer 101 is 150 μm, and the resonator length (L) of the antenna is 150 μm. In the antenna, the semiconductor layer 100 including the RTD is integrated.

The conductor layer 101 as a patch conductor is formed by a metal layer (Ti/Au) mainly including an Au thin film with a low resistivity. The conductor layer 109 as a ground conductor is formed by a Ti/Au layer and a semiconductor layer including n+-InGaAs layer, and the metal layer and the semiconductor layer are connected with low-resistance ohmic contact. The dielectric layer 104 is made of benzocyclobutene (BCB of the Dow Chemical Company). The dielectric layer 105 or 106 is formed by SiO$_2$ with a thickness of 1 μm.

As shown in FIG. 5B, on the periphery of the semiconductor layer 100, the conductor layer 109, the semiconductor layer 100, the via 103 formed by a conductor containing Cu, and the conductor layer 101 are stacked in this order from the side of the substrate 110, and are electrically connected. The RTD as the semiconductor layer 100 is arranged at a position shifted from the center of gravity of the conductor layer 101 by 40% (60 μm) of one side of the conductor layer 101 in the resonance direction (that is, the A-A' direction). The input impedance when supplying a high frequency from the RTD to the patch antenna is decided based on the position of the RTD in the antenna. As shown in FIG. 5C, the conductor layer 101 is connected, via the via 107 formed by Cu, to the wiring 108 existing in the same layer as the bias wiring layer 102 arranged on the dielectric layer 105. The wiring layers 102 and 108 are formed by a metal layer containing Ti/Au stacked on the dielectric layer 105. The wiring 108 is connected to the bias control unit 12 via the bias wiring layer 102 as a common wiring formed in the chip. The active antenna AA is designed to obtain oscillation with power of 0.2 mW at the frequency $f_{THz}$=0.5 THz by setting a bias in the negative resistance region of the RTD included in the semiconductor layer 100.

A via such as the vias 103 and 107 has a columnar structure having a diameter of 10 μm. The wiring 108 is formed by a pattern formed by a metal layer containing Ti/Au and having a width of 10 μm in the resonance direction (that is, the A-A' direction) and a length of 75 μm. The via 107 is at the center in the resonance direction (that is, the A-A' direction), and is connected to the conductor layer 101 at the end of the conductor layer 101 in the C-C' direction. This connection position corresponds to the node of the electric field of the standing terahertz wave of frequency $f_{THz}$ in the active antenna AA$_1$.

The antenna array 11 is an antenna array in which active antennas are arranged in a matrix. In this embodiment, as an example, the antenna array in which the nine active antennas AA$_1$ to AA$_9$ are arranged in a 3×3 matrix has been described. Each active antenna is designed to singly oscillate the terahertz wave of the frequency $f_{THz}$, and the active antennas are arranged at a pitch (interval) of 340 μm both in the A-A' direction and the C-C' direction.

(Manufacturing Method)

A manufacturing method (forming method) of the antenna array 11 will be described next.

(1) First, on the substrate 110 made of InP, an InGaAs/AlAs-based semiconductor multilayer film structure forming the semiconductor layer 100 including the RTD is formed by epitaxial growth. This is formed by Molecular Beam Epitaxy (MBE), Metal Organic Vapor Phase Epitaxy (MOVPE), or the like.

(2) The ohmic electrode Ti/Au layer forming the semiconductor layer 100 is deposited by sputtering.

(3) The semiconductor layer 100 is formed in a mesa structure having a circular shape with a diameter of 2 μm. To form the mesa shape, photolithography and dry etching are used.

(4) After the conductor layer 109 is formed on the substrate 110, silicon oxide is deposited on the etched surface by a lift-off process to obtain the dielectric layer 106. A Ti/Au layer is formed as a conductor forming the wiring layer 125 on the dielectric layer 106. Furthermore, the control line IL is formed on the dielectric layer 106. Note that the control line IL can be implemented in, for example, the form of a slot line, but a line of another form may be used.

(5) Silicon oxide is deposited to obtain the dielectric layer 105. A Ti/Au layer is formed as a conductor forming the wiring layers 102 and 108 on the dielectric layer 105.

(6) BCB is embedded and planarized using spin coating and dry etching to obtain the dielectric layer 104.

(7) BCB and silicon oxide of the portions forming the vias 103 and 107 are removed by photolithography and dry etching to form via holes (contact holes).

(8) The vias 103 and 107 are formed in the via holes by conductors containing Cu. To form the vias 103 and 107, Cu is embedded in the via holes and planarized using sputtering, electroplating, and chemical mechanical polishing.

(9) An electrode Ti/Au layer is deposited by sputtering to obtain the conductor layer 101 of each antenna. The conductor layer 101 is patterned by photolithography and dry etching.

(10) Silicon nitride is deposited to obtain a dielectric layer 112.

(11) Finally, the resistance layer 127 and the MIM capacitor 126 are formed and connected to the wiring layer 102 and the bias control unit 12 by wire bonding or the like, thereby completing the antenna array 11.

Note that the bias control unit 12 supplies power to the antenna apparatus 10. Normally, if a bias voltage is applied to supply a bias current in the negative differential resistance region, the antenna apparatus 10 operates as an oscillator.

Second Embodiment

Figure 3A:
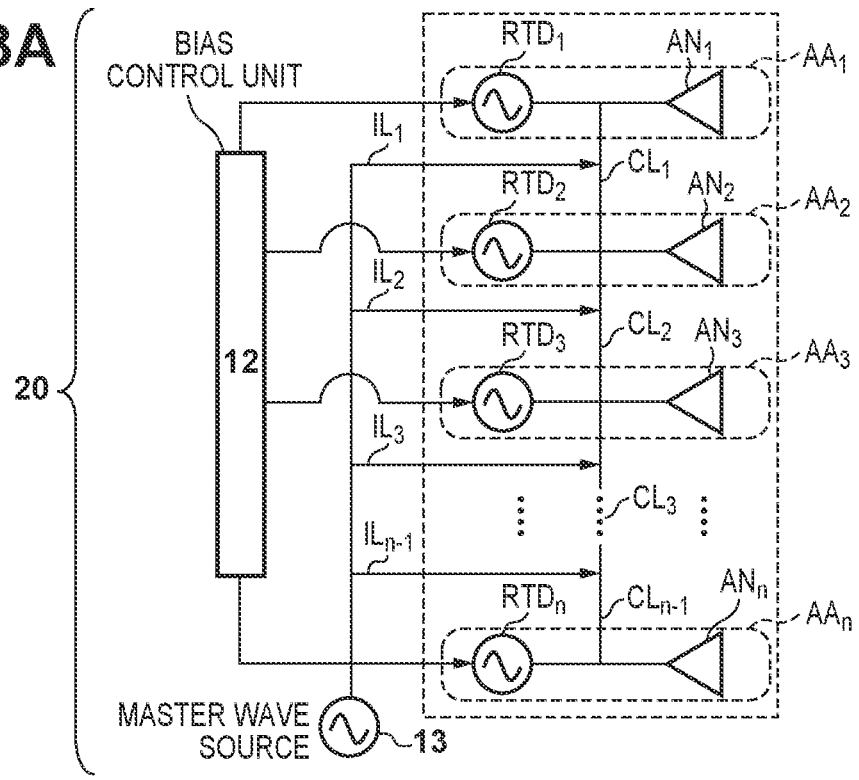
FIG. 3A is a block diagram showing an antenna apparatus 20.
Figure 3B:
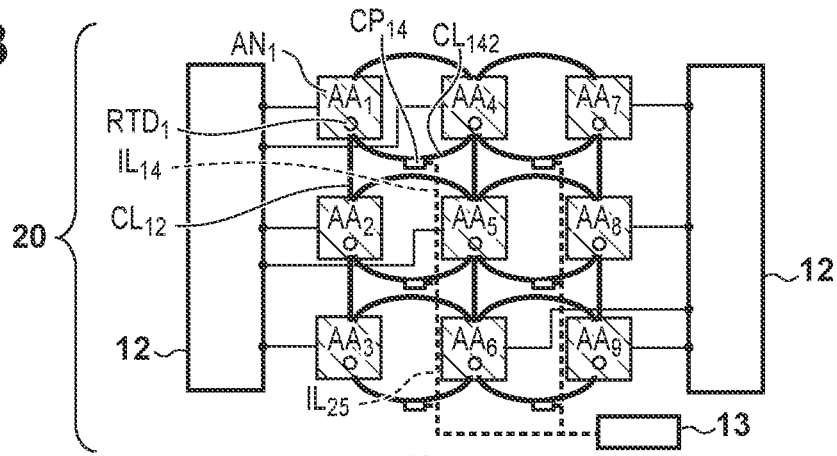
FIG. 3B is a schematic plan view showing the first arrangement example of the antenna apparatus 20.
Figure 3C:
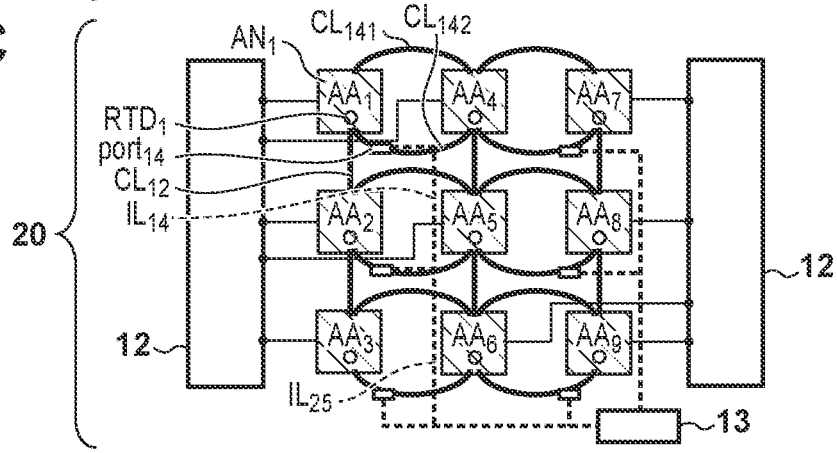
FIG. 3C is a schematic plan view showing the first arrangement example of the antenna apparatus 20.

In this embodiment, a method in which a master oscillator 13 injects a master signal in an antenna apparatus 20 that couples active antennas by coupling lines to generate a mutual injection locking phenomenon will be described. FIGS. 3A to 3C show the arrangement of the antenna apparatus 20. FIG. 3A is a block diagram for explaining the system configuration of the antenna apparatus 20, and FIGS. 3B and 3C are schematic plan views of the antenna apparatus 20 when viewed from above.

As shown in FIG. 3A, the antenna apparatus 20 according to this embodiment has an arrangement obtained by adding, to the antenna apparatus 10 of the first embodiment, coupling lines $CL_1$ to $CL_{n-1}$ between the active antennas. The coupling line CL is a transmission line for performing mutual injection locking at a frequency $f_{osc}$, and the active antennas are electrically connected by the coupling line CL. For example, in an example shown in FIGS. 3B and 3C in which the active antennas are arranged in a 3×3 matrix, the adjacent active antennas are coupled by a coupling line in the arrangement. In an example, to establish synchronization between active antenna $AA_1$ and $AA_4$ in the horizontal direction, two coupling lines $CL_{141}$ and $CL_{142}$ are connected between the active antennas. Note that the same applies to the remaining active antennas. The coupling line is implemented as, for example, a microstrip line. However, the present invention is not limited to this, and the coupling line may be implemented by a slot line. By connecting the active antennas by the coupling line, it is possible to improve the accuracy of a frequency and a phase.

Figure 4B:
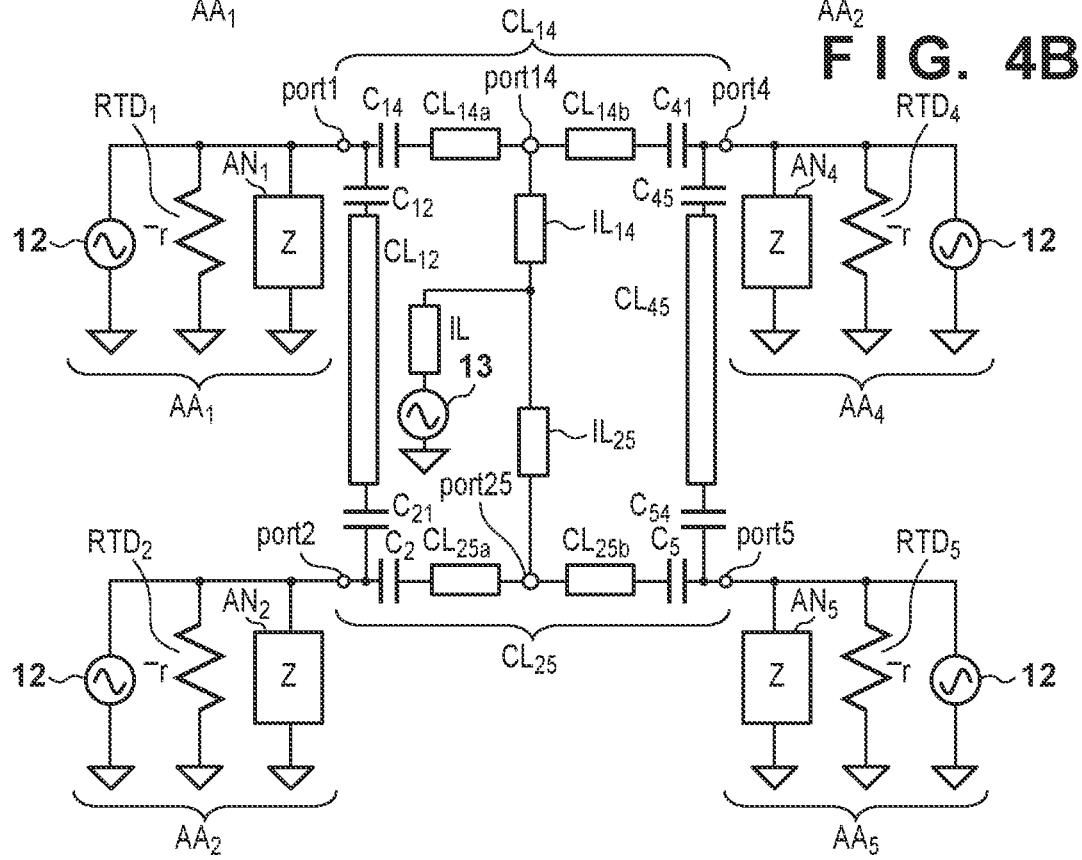

FIG. 4B is a circuit diagram for explaining the master oscillator 13 that is connected between the active antennas $AA_1$ and $AA_4$ and injects a master signal. As shown in FIG. 4B, the adjacent active antennas $AA_1$ and $AA_4$ are electrically connected via a coupling line $CL_{14}$ at ports 1 and 4. This couples the active antennas $AA_1$ and $AA_4$ in a terahertz band, thereby making it possible to control the frequency and phase. Note that the active antenna $AA_1$ and an active antenna $AA_2$ and the active antenna $AA_4$ and an active antenna $AA_5$ are mutually coupled via other coupling lines, respectively.

The coupling line $CL_{14}$ includes two series-connected lines $CL_{14a}$ and $CL_{14b}$ which are connected to the active antennas $AA_1$ and $AA_4$ via capacitors $C_{14}$ and $C_{41}$, respectively. The capacitors $C_{14}$ and $C_{41}$ function as high-pass filters, and are set to be capacitors configured to be short-circuited with respect to an electromagnetic wave in the terahertz band and to be open with respect to an electromagnetic wave in a low-frequency band. The same applies to the connection between the coupling line and the active antennas $AA_2$ and $AA_5$. Ports 14 and 25 are ports at which the master signal is injected from the master oscillator 13 into the coupling line $CL_{14}$ and a coupling line $CL_{25}$, and are arranged between the coupling lines $CL_{14a}$ and $CL_{14b}$ and between coupling lines $CL_{25a}$ and $CL_{25b}$, respectively, in this embodiment. By setting a difference in electrical length between control lines $IL_{14}$ and $IL_{25}$ to an integer multiple of the wavelength of the master signal, the phases of the master signals can be matched in semiconductors RTD of the active antennas AA. In an example, if the positions of the ports 14 and 25 are set at the center of the coupling line $CL_{14}$, as shown in FIG. 3B, the master signals injected into the respective semiconductors RTD are synchronized with each other. As shown in FIG. 3C, an arrangement in which the master signal is injected into the position of the node of the electric field of the terahertz wave of the coupling line $CL_{14}$ may be used. In this arrangement, it is possible to differentiate the phases of the master signals injected into the respective semiconductors RTD, thereby making the antenna apparatus 20 function as a directional antenna.

Implementation Example

Subsequently, the structure and arrangement of the above-described antenna apparatus 20 will be described with reference to FIGS. 6A to 6D. FIG. 6A is a schematic plan view of an antenna array 21 in which the nine active antennas $AA_1$ to $AA_9$ are arranged in a 3×3 matrix. FIGS. 6B to 6D are sectional views of the antenna array 21 taken along lines A-A', B-B', C-C', and D-D' in FIG. 6A, respectively. Note that a detailed description of the same components as those of the antenna apparatus 10 of the first embodiment will be omitted below.

In the arrangement shown in FIG. 6A, the adjacent antennas are mutually coupled by the coupling line CL, and are synchronized with each other by a mutual injection locking phenomenon at an oscillation frequency $f_{THz}$ of a terahertz wave. The mutual injection locking phenomenon is a phenomenon in which a plurality of self oscillators are pulled by interaction to oscillate in synchronism with each other. For example, the active antennas $AA_1$ and $AA_4$ are mutually coupled by the coupling line $CL_{14}$, and are mutually coupled via a conductor layer 109, as shown in FIG. 6B. Note that a conductor layer 111 is made of, for example, Ti/Au. The same applies to other adjacent active antennas. Note that "mutually coupled" indicates such relationship that when a current induced by a given active antenna acts on another adjacent active antenna, the transmission/reception characteristic of one another is changed. If the mutually coupled active antennas are synchronized with each other in the same phase or opposite phases, the mutual injection locking phenomenon causes electromagnetic waves to strengthen or weaken each other between the active antennas. This can adjust the increase/decrease of the antenna gain. Note that in this embodiment, to generally represent the coupling line that couples the active antennas, it is described as the coupling line CL. A coupling line that forms the coupling line CL and couples the antennas is described using a number and alphabet corresponding to each active antenna. For example, the coupling line that couples the active antennas $AA_1$ and $AA_4$ is described as the coupling line $CL_{14}$.

The oscillation condition of the antenna array 11 is decided by the condition of mutual injection locking in an arrangement in which two or more individual RTD oscillators are coupled, which is described in J. Appl. Phys., Vol. 103, 124514 (2008). More specifically, consider the oscillation condition of the antenna array in which the active antennas $AA_1$ and $AA_2$ are coupled by the coupling line $CL_{12}$. At this time, two oscillation modes of positive-phase mutual injection locking and negative-phase mutual injection locking occur. The oscillation condition of the oscillation mode (even mode) of positive-phase mutual injection locking is represented by expression (4) and equation (5), and the oscillation condition of the oscillation mode (odd mode) of negative-phase mutual injection locking is represented by expression (6) and equation (7).

positive phase (even mode): frequency f=feven $Yeven=Y11+Y12+YRTD$ $Re(Yeven) \leq 0$ (4)

$Im(Yeven)=0$ (5)

negative phase (odd mode): frequency f=fodd $Yodd=Y11+Y12-YRTD$ $Re(Yodd) \leq 0$ (6)

$Im(Yodd)=0$ (7)

where Y12 represents the mutual admittance between the active antennas $AA_1$ and $AA_2$. Y12 is proportional to a coupling constant representing the strength of coupling between the antennas, and ideally, the real portion of −Y12 is large and the imaginary portion is zero. In the antenna array 11 of this embodiment, the active antennas are coupled under the condition of positive-phase mutual injection locking, and oscillation frequency $f_{THz} \approx$ feven is obtained. Similarly, with respect to the remaining antennas, the antennas are coupled by the coupling line CL to satisfy the above-described condition of positive-phase mutual injection locking.

The coupling line CL is a microstrip line obtained by sandwiching the dielectric layers 104 to 106 by the conductor layer 111 and the conductor layer 109 or a wiring layer 102. For example, as shown in FIG. 5B, a coupling line $CL_{45}$ has a structure in which the dielectric layers 104 to 106 are sandwiched by the conductor layer 111 ($CL_{45}$) and the conductor layer 109 or the wiring layer 102. Similarly, a coupling line $CL_{56}$ has a structure in which the dielectric layers 104 to 106 are sandwiched by the conductor layer 111 ($CL_{56}$) and the conductor layer 109 or the wiring layer 102.

The antenna array 11 is an antenna array having an arrangement in which the antennas are coupled by AC coupling (capacitive coupling). For example, in a planar view, the conductor layer 111 as the upper conductor layer of the coupling line $CL_{45}$ overlaps a conductor layer 101 as the patch conductor of each of the active antennas $AA_4$ and $AA_5$ by sandwiching an dielectric layer 112, and is connected to the conductor layer 101 by capacitive coupling. More specifically, in a planar view, the conductor layer 111 of the coupling line $CL_{45}$ overlaps the conductor layer 101 by only 5 μm by sandwiching the dielectric layer 112 near the radiation end of each of the active antennas $AA_4$ and $AA_5$, thereby forming each of capacitor structures $C_1$ and $C_2$. The capacitor structures $C_1$ and $C_2$ correspond to the capacitors $C_{14}$ and $C_{41}$ in the circuit diagram shown in FIG. 4B. The capacitors $C_1$ and $C_2$ of this arrangement function as high-pass filters, and contribute to suppression of multi-mode oscillation by being short-circuited with respect to a terahertz band and being open with respect to a low-frequency band. However, this arrangement is not an essential requirement, and an arrangement of DC coupling such that the conductor layer 111 of the coupling line $CL_{45}$ and the conductor layers 101 of the active antennas $AA_4$ and $AA_5$ are directly coupled (directly connected) may be used. Since the antenna array synchronized by DC coupling can synchronize the adjacent antennas by strong coupling, the antenna array readily performs a pull-in synchronization operation, and is resistant against variations of the frequency and phase of the antenna. Note that coupling between the active antennas $AA_4$ and $AA_5$ has been exemplified, but the same applies to couplings among the remaining active antennas $AA_1$ to $AA_9$.

In the antenna array 21, the conductor layer 101 of the active antenna AA, the conductor layer 111 of the coupling line CL, and the bias wiring layer 102 are arranged in different layers. As described above, the conductor layer 101 of the active antenna AA and the conductor layer 111 of the coupling line CL that transmit a high frequency ($f_{THz}$) and the bias wiring layer that transmits a low frequency (DC to several tens of GHz) are arranged in different layers. This can freely set the width, the length, and the layout, such as routing, of the transmission line in each layer. As shown in FIG. 5A, the coupling line CL and the bias wiring layer 102 intersect each other when viewed from above (in a planar view), thereby obtaining a layout-saving arrangement. This can increase the number of antennas to be arranged even in an antenna array in which antennas are arranged in an m×n (m≥2, n≥2) matrix. Furthermore, impedance control of the coupling line CL and bias control of the semiconductor layer 100 can be executed individually.

Note that since resistance by the skin effect increases in the terahertz band, a conductor loss along with high-frequency transmission between antennas is not negligible. Along with an increase in current density between conductor layers, a conductor loss (dB/mm) per unit length increases. In the case of a microstrip line, a conductor loss (dB/mm) per unit length is inversely proportional to the square of a dielectric thickness. Therefore, to increase the radiation efficiency of the antenna array, it is possible to reduce a conductor loss by increasing the thickness of the dielectric forming the coupling line CL in addition to the antenna. To the contrary, the antenna array 21 of this embodiment has an arrangement in which the bias wiring layer 102 is arranged in the dielectric layer 105, and the conductor layer 101 of the antenna and the conductor layer 111 of the coupling line CL that transmit a high frequency of the frequency $f_{THz}$ are arranged in the upper layer of the dielectric layer 104. This arrangement can suppress a decrease in radiation efficiency of the antenna array along with a conductor loss in the terahertz band. From the viewpoint of a conductor loss, the thickness of the dielectric forming the coupling line CL is preferably 1 μm or more. In an example, the dielectric thickness is set to 2 μm or more, and thus a loss by a conductor loss in the terahertz band is suppressed to about 20%. Similarly, from the viewpoint of a conductor loss, a wide interval in the thickness direction between the conductor layer 111 forming the coupling line CL and the wiring layer 102 and conductor layer 109 can be ensured. The bias wiring layer 102 can be made to function as a low-impedance line up to a gigahertz band or thereabouts by setting the dielectric thickness to 2 μm or less, or 1 μm or less in an example. Even if the dielectric thickness is set to 2 μm or more, it is possible to suppress low-frequency oscillation by connecting, to the bias wiring layer 102, a shunt component formed by a resistance layer 127 and a MIM capacitor 126 to function as a low-impedance line, as in this embodiment.

Note that the length of the conductor layer 111 (coupling line CL) is designed to satisfy a phase matching condition in one or both of the horizontal direction (magnetic field direction/H direction) and the vertical direction (electric field direction/E direction) if the adjacent antennas are connected by the coupling line. The coupling line CL can be designed to have, for example, such length that the electrical length between the RTDs of the adjacent antennas is equal to an integer multiple of $2\pi$. That is, the length of the coupling line CL is set so that the length of a path via the coupling line CL when the RTDs are connected by the coupling line CL is equal to an integer multiple of the wavelength of a propagated electromagnetic wave. For example, in FIG. 6A, the coupling line $CL_{14}$ extending in the horizontal direction can be designed to have such length that the electrical length between the semiconductor layers 100 of the active antennas $AA_1$ and $AA_4$ is equal to $4\pi$. Furthermore, the coupling line $CL_{12}$ extending in the vertical direction can be designed to have such length that the electrical length between the semiconductor layers 100 of the active antennas $AA_1$ and $AA_2$ is equal to $2\pi L$. Note that the electrical length indicates a wiring length considering the propagation speed of the electromagnetic wave of the high frequency that propagates in the coupling line CL. The electrical length of $2\pi$ corresponds to the length of one wavelength of the electromagnetic wave propagating in the coupling line CL. With such design, the semiconductor layers 100 of the active antennas $AA_1$ to $AA_9$ are mutual injection-locked in the positive phase. Note that the error range of the electrical length within which mutual injection locking occurs is $\pm\frac{1}{4}\pi$.

Note that the conductor layer 111 is formed by, for example, in (10) described above, depositing silicon nitride to obtain the dielectric layer 112, and then depositing an electrode Ti/Au layer by sputtering to obtain the conductor layer 111. After that, the conductor layer 111 is patterned by photolithography and dry etching.

The active antennas $AA_1$ to $AA_9$ forming the antenna array 11 are supplied with power by the common bias wiring layer 102 arranged among the antennas. By sharing, among the antennas, the bias wiring layer 102 as the wiring in the chip, driving in the same channel is possible and the driving method can be simplified. In this arrangement, since the number of wirings is decreased and one wiring can be thickened, it is possible to suppress an increase in wiring resistance along with an increase in number of arrays and a deviation in operating point among the antennas along with that. This can suppress deviations in frequency and phase among the antennas caused by the increase in number of arrays, thereby more easily obtaining the synchronization effect by the array. The common bias wiring layer 102 is not an essential component. For example, by stacking or miniaturizing a multilayer wiring, a plurality of bias wiring layers 102 may be prepared for the respective antennas to individually supply power. In this case, since isolation via the bias wiring layer 102 between the antennas is enhanced, the risk of a low-frequency parasitic oscillation can be reduced. Furthermore, signal modulation control for each antenna can be performed by individual control of a bias signal. The bias wiring layer 102 can be configured to have a low impedance, as compared with the negative resistance of the semiconductor layer 100, in a low frequency band lower than the oscillation frequency $f_{THz}$. An impedance of a value equal to or slightly smaller than the absolute value of the combined negative differential resistance of all the semiconductor layers 100 connected in parallel in the antenna array 11 is preferable. This can suppress a low-frequency parasitic oscillation.

A control line IL is connected to the coupling line CL. For example, as shown in FIG. 6A, the $port_{14}$ coupled to the control line IL is provided at the center of the coupling line $CL_{14}$ between the active antennas $AA_1$ and $AA_4$. As shown in FIG. 6C, the control line IL is formed, for example, between the dielectric layers 112 and 104, and can be configured to be capacitively coupled to the conductor layer 111 of the coupling line CL. Note that this is merely an example, and the coupling line CL and the control line IL may directly be coupled. The master signal output from the master oscillator 13 passes through, for example, the control line IL, and is injected into the coupling line $CL_{14}$ at the $port_{14}$, and the active antennas $AA_1$ and $AA_4$ can accurately establish synchronization based on the master signal. Note that the active antennas $AA_1$ and $AA_4$ have been described but the remaining active antennas perform the same operation with the same arrangement.

Third Embodiment

Figure 7A:
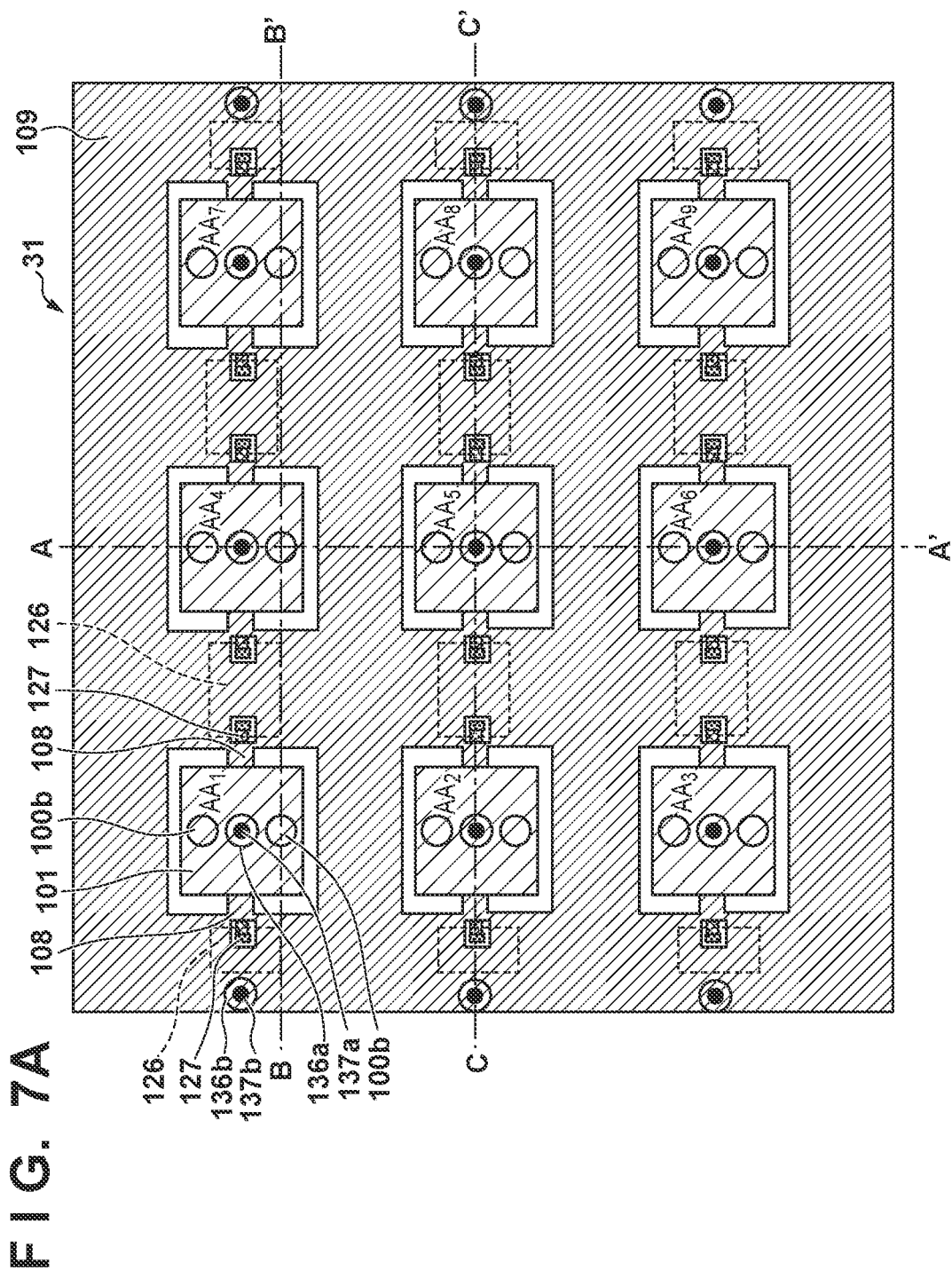
FIG. 7A is a plan view of the third example of an antenna array.
Figure 7B:
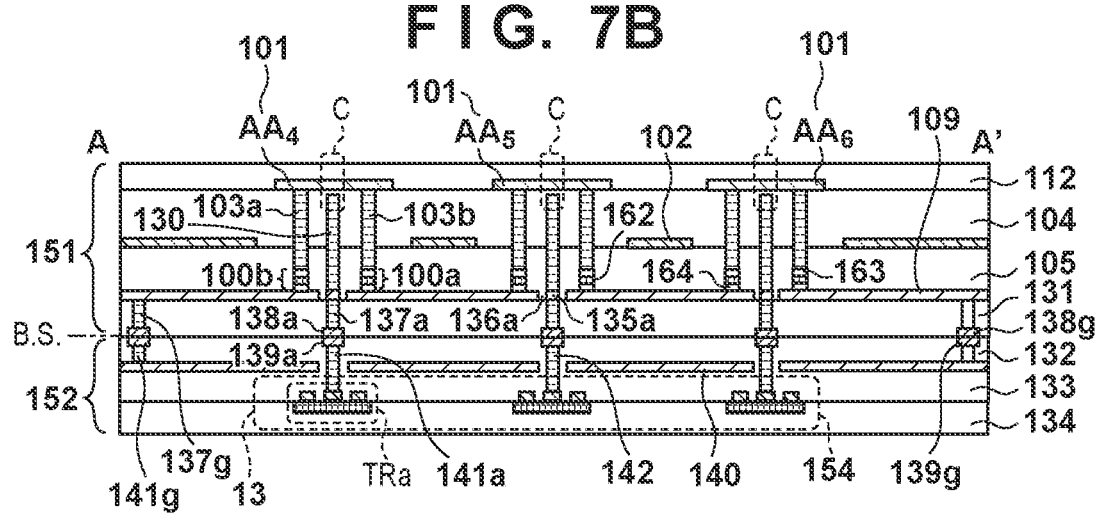
FIGS. 7B to 7D are sectional views of the third example of the antenna array.
Figure 7C:
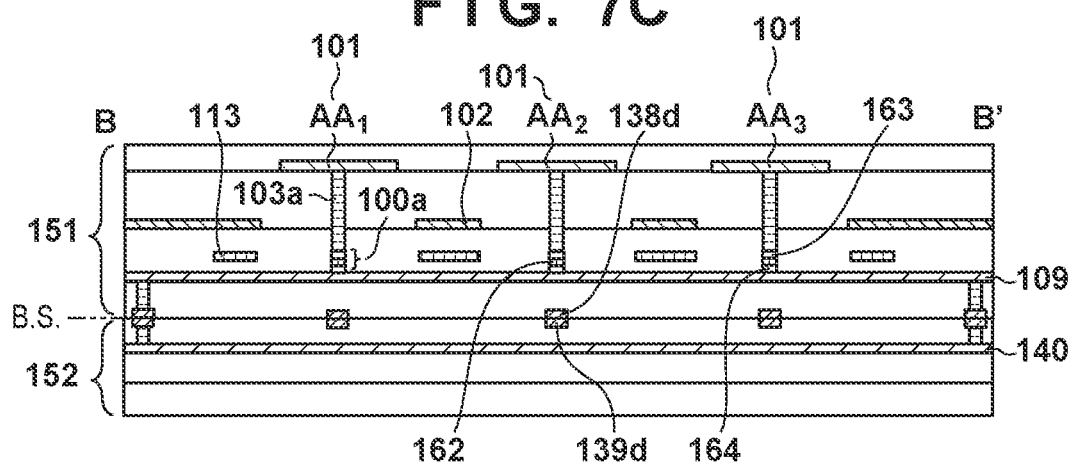
Figure 7D:
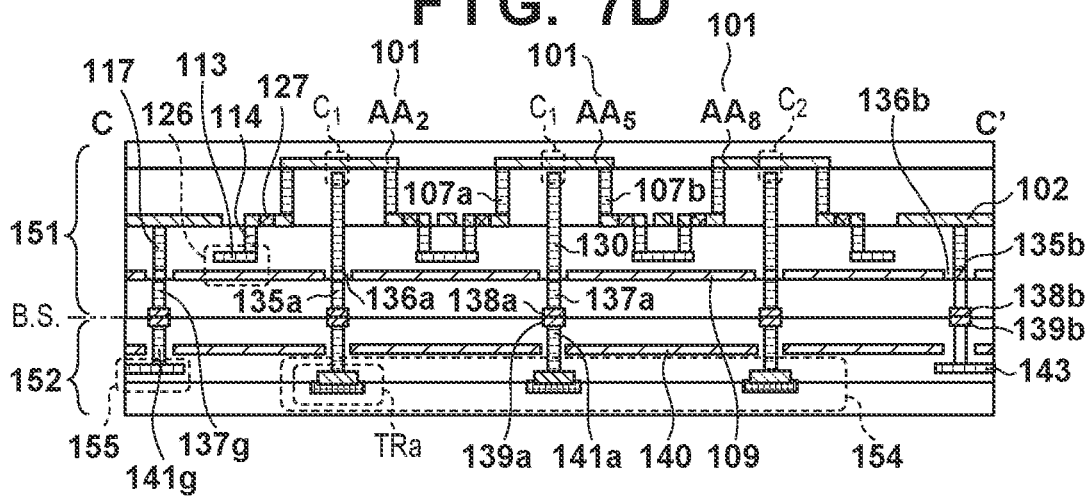

Subsequently, another form of an antenna apparatus will be described with reference to FIGS. 7A to 7D. FIG. 7A is a schematic plan view of an antenna array 31 according to this embodiment. FIGS. 7B to 7D are sectional views of the antenna array 31 taken along lines A-A', B-B', and C-C' in FIG. 7A, respectively.

In this embodiment, as shown in FIGS. 7B to 7D, a first substrate 151 on which an antenna array for transmitting/receiving a terahertz wave and a semiconductor layer 100 formed from a compound semiconductor are integrated, and a second substrate 152 including an integrated circuit for antenna array control are bonded at a bonding surface B.S. This arrangement is implemented by stacking, by a semiconductor stacking technique, an antenna substrate of a compound semiconductor including an antenna array and an Si integrated circuit substrate. In the antenna array 31, wirings from the second substrate 152 are electrically connected to active antennas $AA_1$ to $AA_9$, respectively. The active antenna AA includes a conductor layer 101 of the antenna, two semiconductor layers 100a and 100b, a conductor layer 109 (reflector), and dielectric layers 104 and 105. Furthermore, the active antenna AA includes vias 103a and 103b that connect the conductor layer 101 and the semiconductor layers 100. In an example, RTDs are used as the semiconductor layers 100a and 100b. The two RTDs are arranged at positions facing each other with the center of the node of a resonance electric field in the active antenna AA. In this arrangement, the two RTDs oscillate in a push-pull mode in which mutual injection locking occurs in a state (in opposite phases) in which the phases are reversed. As described above, in the arrangement in which the RTDs are vertically and horizontally, symmetrically arranged in the antenna, it is easy to obtain the effect of improvement of directivity and front strength along with an increase in number of arrays.

As shown in FIG. 7B, in the semiconductor layer 100, a lower electrode layer 164, a semiconductor structure 162, and an upper electrode layer 163 are stacked in this order from the side of the conductor layer 109, and are electrically connected. The semiconductor structure 162 is a semiconductor structure having nonlinearity and an electromagnetic wave gain with respect to a terahertz wave, and an RTD is used in this embodiment. The upper electrode layer 163 and the lower electrode layer 164 have a structure serving as an electrode layer for connecting contact electrodes (ohmic and Schottky electrodes) above and below the semiconductor structure 162 and upper and lower wiring layers in order to apply a potential difference or a current to the semiconductor structure 162. The upper electrode layer 163 and the lower electrode layer 164 can be made of a metal material (Ti/Pd/Au/Cr/Pt/AuGe/Ni/TiW/Mo/ErAs or the like) known as an ohmic electrode or Schottky electrode, or a semiconductor doped with impurities. When the upper electrode layer 163 is connected to the via 103 and the lower electrode layer 164 is connected to the conductor layer 109, a potential difference or a current is applied to the semiconductor structure 162. Therefore, it can be said that the upper electrode layer 163 and the via 103 and the lower electrode layer 164 and the conductor layer 109 are connected to two power lines, respectively.

To apply a bias control signal to the semiconductor layer 100, a common bias wiring layer 102 is provided for all the active antennas $AA_1$ to $AA_9$. As shown in FIG. 7D, the wiring layer 102 is connected, at the position of the node of a resonance electric field of a frequency $f_{THz}$, to the active antennas $AA_1$ to $AA_9$ by vias 107a and 107b arranged for the respective antennas. The wiring layer 102 is connected to a MIM capacitor 126 and a resistance layer 127 arranged for each antenna, and AC short-circuits a high frequency other than the frequency $f_{THz}$, thereby reducing an impedance. These components suppress multi-mode oscillation in the array antenna. As shown in FIG. 7D, the bias wiring layer 102 connected to the semiconductor layer 100 of the first substrate 151 is electrically connected to a bias control wiring layer 143 provided in an integrated circuit region 154 of the second substrate 152. The bias wiring layer 102 of the first substrate 151 is electrically connected to a via 117, a wiring layer 135b, a through via 137b, and an electrode layer 138b in this order to reach the bonding surface B.S. Note that the via 117 is formed to extend through the dielectric layer 105, and is connected to the wiring layer 135b provided in an opening 136b of the conductor layer 109 as a reflector. Then, the wiring layer 135b is connected to the bonding electrode layer 138b provided in an insulating layer 148 through the through via 137b provided in an insulating layer 131. Similarly, in the second substrate 152, the bias control wiring layer 143 is connected to a via 141b and a bonding electrode layer 139b in this order to reach the bonding surface B.S. When the first substrate 151 and the second substrate 152 are bonded to each other, and the electrode layers 138b and 139b are connected to each other, the bias wiring layer 102 of the antenna array and the wiring layer 143 in the integrated circuit region 154 are rendered conductive. This sets a state in which the bias control signal can be applied to all the antennas. The bias signal can be externally supplied to the bias control wiring layer 143 via an application terminal additionally provided on the second substrate 152.

Each of the active antennas $AA_1$ to $AA_9$ has a via 130 for coupling an injection locking signal from the master oscillator 13. The via 130 is capacitively coupled to the conductor layer 101 of the active antenna via a capacitor C, and the master oscillator 13 and the active antenna AA are connected to be short-circuited with respect to a terahertz band and to be open with respect to an RF band. Furthermore, the via 130 is connected at the position of the node of the resonance electric field of the frequency $f_{THz}$ in each of the active antennas $AA_1$ to $AA_9$. Thus, the via 130 has a high impedance with respect to the frequency $f_{THz}$ and a low impedance with respect to a subharmonic frequency in the antenna, thereby making it possible to increase the terahertz radiation efficiency and the injection efficiency of a master signal.

The active antenna AA is electrically connected, via the via 130 for master oscillation, to the gate of a transistor TRa (MOSFET) of the master oscillator 13 provided in the integrated circuit region 154 of the second substrate 152. The via 130 for master synchronization formed in the dielectric layers 104 and 105 of the first substrate 151 is electrically connected to a wiring layer 135a, a through via 137a, and an electrode layer 138a in this order to reach the bonding surface B.S. Note that the wiring layer 135a is provided in an opening 136a of the conductor layer 109 as a reflector, and the through via 137a is provided in the insulating layer 131. Similarly, the transistor TRa formed in the integrated circuit region 154 of the second substrate 152 is connected to a via 141a formed in the integrated circuit region 154 and a bonding electrode layer 139a in this order to reach the bonding surface B.S. The first substrate 151 and the second substrate 152 are bonded at the bonding surface B.S., thereby electrically connecting the electrode layer 138a of the first substrate 151 and the electrode layer 139a of the second substrate 152 at the bonding surface B.S. Thus, each of the active antennas $AA_1$ to $AA_9$ and the transistor TRa for individually controlling each active antenna are rendered conductive, and a control signal can individually be applied to each active antenna. As described above, each active antenna forms, by the upper electrode layer 163 and the via 103, and the lower electrode layer 164 and the conductor layer 109, a bias structure that applies a potential difference from above and below the semiconductor structure 162. A subharmonic signal from the master oscillator 13 is injected into the semiconductor layers 100a and 100b via the path. Therefore, a power signal of a subharmonic frequency (for example, $f_{THz}/2$) from the master oscillator 13 is injected into the semiconductor layers 100a and 100b each formed from the RTD having the role of an oscillation source in the active antenna, thereby forcibly controlling the phase of each active antenna. As shown in FIG. 7B that is a sectional view, the electrode layer 138g and the electrode layer 139g that are electrically connected to each other are located between the active antenna array $AA_1$ to $AA_9$ and an edge of the first substrate 151. In addition, as shown in FIG. 7C that is a sectional view, the electrode layer 138 and the electrode layer 139 that are electrically connected to each other are located between the active antenna array $AA_1$ to $AA_9$ and an edge of the first substrate 151. By employing such a structure, a resistance value regarding the conductor layer 109 and the conductor layer 140 can be reduced. Also, by such a structure, bonding strength can be enhanced. Also, as shown in FIG. 7C, the electrode layer 138d and the electrode layer 139d may be located under the active antenna array $AA_1$ to $AA_9$. By such a structure, bonding strength at the boding surface can be enhanced.

As described above, according to the arrangement of this embodiment, a low harmonic wave ($f_{THz}/2N$, N is a natural number) of a terahertz wave is injected as a master signal into the active antenna operating at the frequency $f_{THz}$. With injection locking occurring due to injection of the master signal, timing control of the active antenna at the frequency $f_{THz}$ can be executed, thereby reducing phase noise.

Fourth Embodiment

Figure 4C:
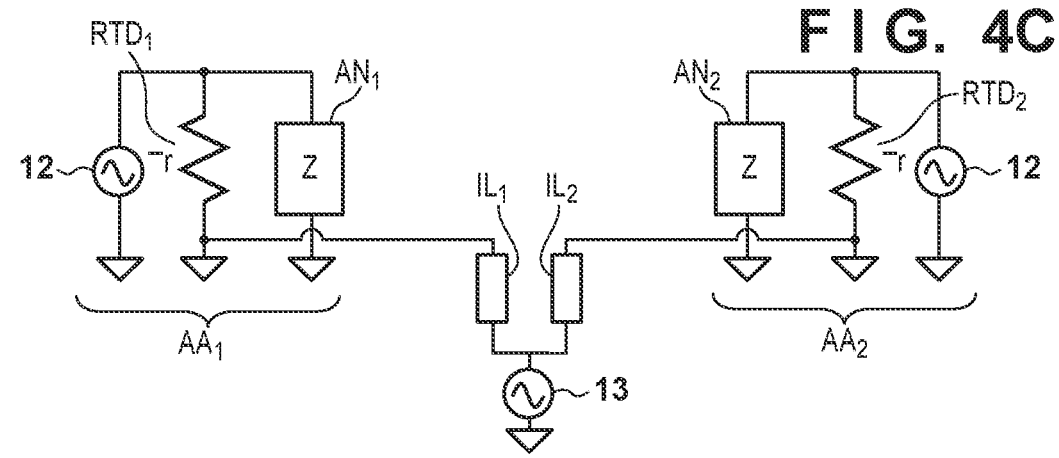
Figure 8A:
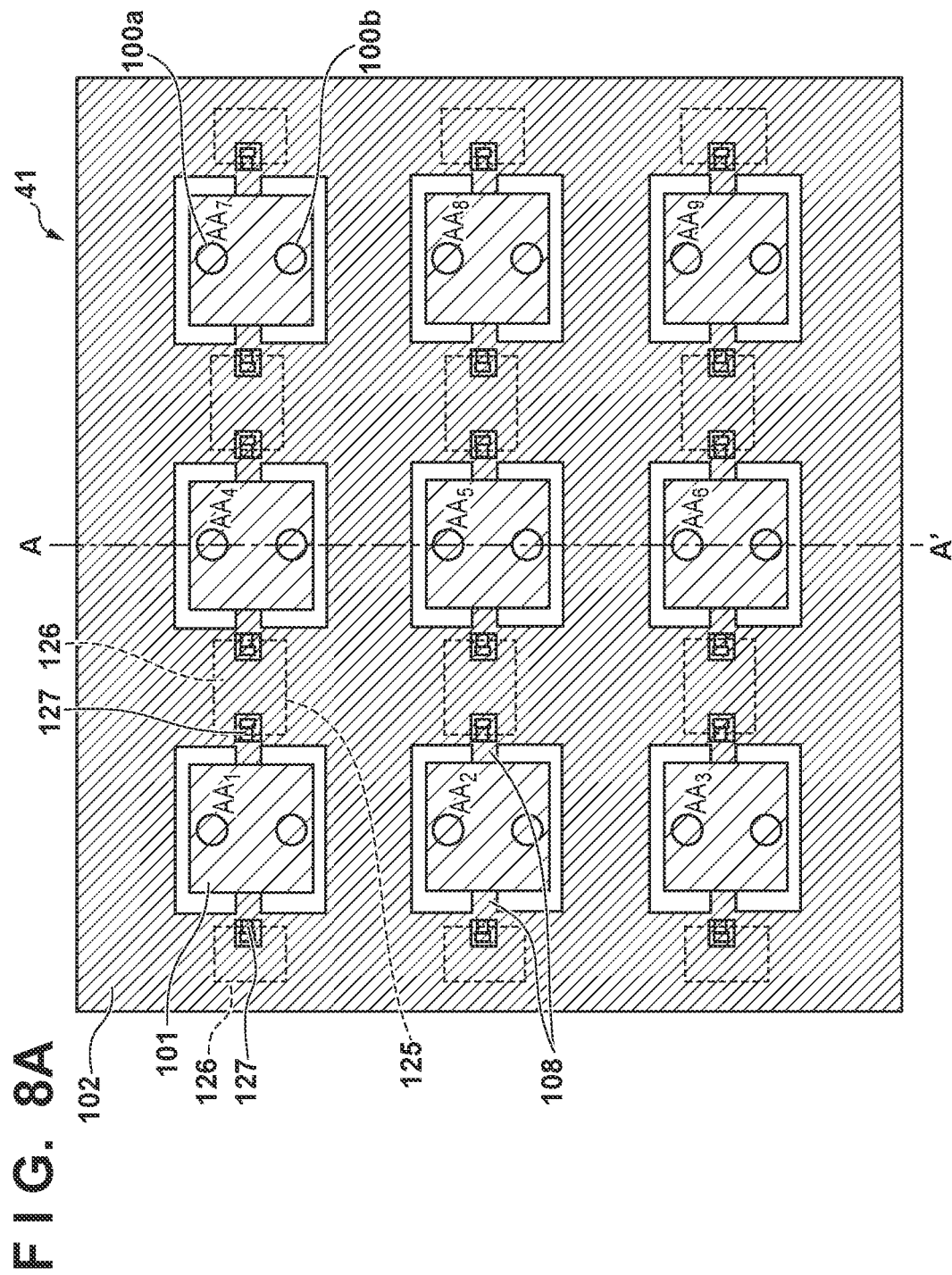
FIG. 8A is a plan view of the fourth example of an antenna array.
Figure 8B:
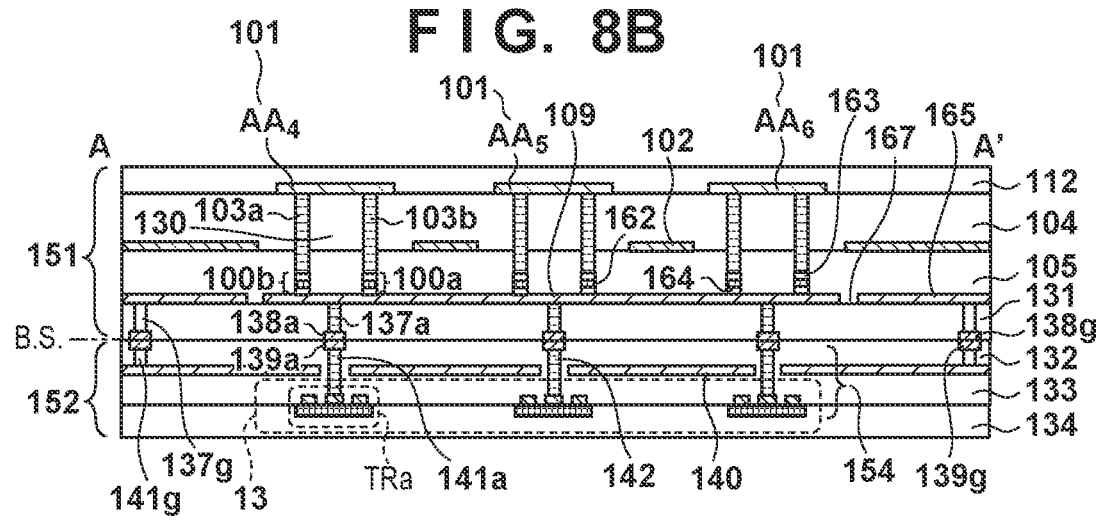
FIGS. 8B and 8C are sectional views of the fourth example of the antenna array.
Figure 8C:
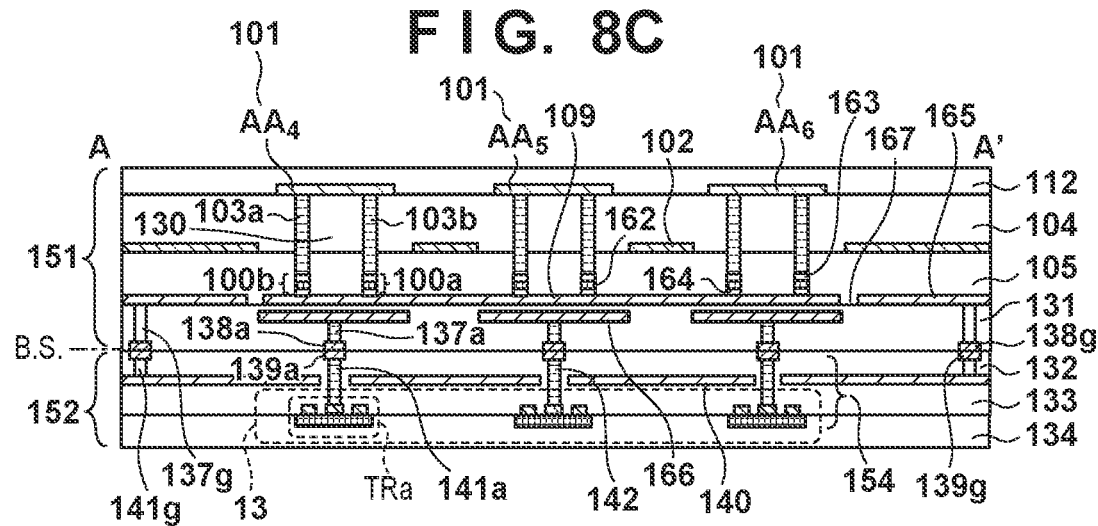

In the arrangement of each of the above-described embodiments, an example in which the control line IL connected to the master oscillator 13 is electrically connected to, out of the two power lines for giving a potential difference, a power line of a high potential applied with a bias by the bias control unit 12 has been explained. To the contrary, in this embodiment, a control line IL is electrically connected to a power line (for example, a ground conductor) of a low potential out of two power lines for giving a potential difference. FIG. 4C shows a circuit diagram for explaining this arrangement. FIG. 8A is a schematic plan view of an antenna array 41 having such arrangement, and FIGS. 8B and 8C are sectional views of the antenna array 41 taken along a line A-A' in FIG. 8A. Similar to the antenna array 31 of the third embodiment, as an example, the antenna array 41 has an arrangement in which a first substrate 151 on which a semiconductor layer 100 is integrated and a second substrate 152 including an integrated circuit for antenna array control are bonded at a bonding surface B.S. Note that a description of the same components as those of the antenna array 31 will be omitted.

In this embodiment, as shown in FIG. 8B, a through via 137 extending from a master oscillator 13 is connected to a conductor layer 109 as a reflector layer of the antenna. In this case, by providing a slit 167, the conductor layer 109 corresponding to terahertz GND and a substrate GND layer 165 are electrically isolated. This can inject a signal from the master oscillator 13 into an active antenna with lower noise. Furthermore, as shown in FIG. 8C, the through via 137 extending from the master oscillator 13 and a conductor layer 166 arranged in an insulating layer 131 can be connected. In this case, the band is limited by capacitive coupling using the capacitive structure formed by the conductor layers 109 and 166, and the master oscillator 13 and the conductor layer 109 as the reflector layer of the antenna can be connected.

With this arrangement, a complex wiring from the master oscillator 13 is unnecessary, thereby making it possible to implement an antenna apparatus with suppressed phase noise by a simple structure.

Fifth Embodiment

Figure 9A:
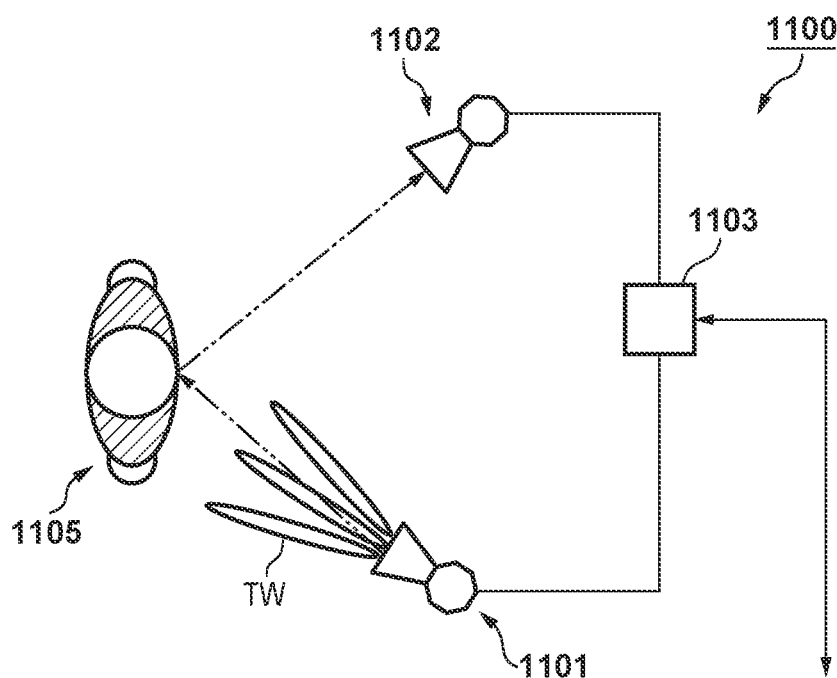
FIG. 9A is a view showing a camera system using an antenna apparatus.

This embodiment will describe a case in which the antenna apparatus of one of the above-described embodiments is applied to a terahertz camera system (image capturing system). The following description will be provided with reference to FIG. 9A. A terahertz camera system 1100 includes a transmission unit 1101 that emits a terahertz wave, and a reception unit 1102 that detects the terahertz wave. Furthermore, the terahertz camera system 1100 includes a control unit 1103 that controls the operations of the transmission unit 1101 and the reception unit 1102 based on an external signal, processes an image based on the detected terahertz wave, or outputs an image to the outside. The antenna apparatus of each embodiment may serve as the transmission unit 1101 or the reception unit 1102.

The terahertz wave emitted from the transmission unit 1101 is reflected by an object 1105, and detected by the reception unit 1102. The camera system including the transmission unit 1101 and the reception unit 1102 can also be called an active camera system. Note that in a passive camera system without including the transmission unit 1101, the antenna apparatus of each of the above-described embodiments can be used as the reception unit 1102.

By using the antenna apparatus of each of the above-described embodiments that can perform beamforming, it is possible to improve the detection sensitivity of the camera system, thereby obtaining a high quality image.

Sixth Embodiment

Figure 9B:
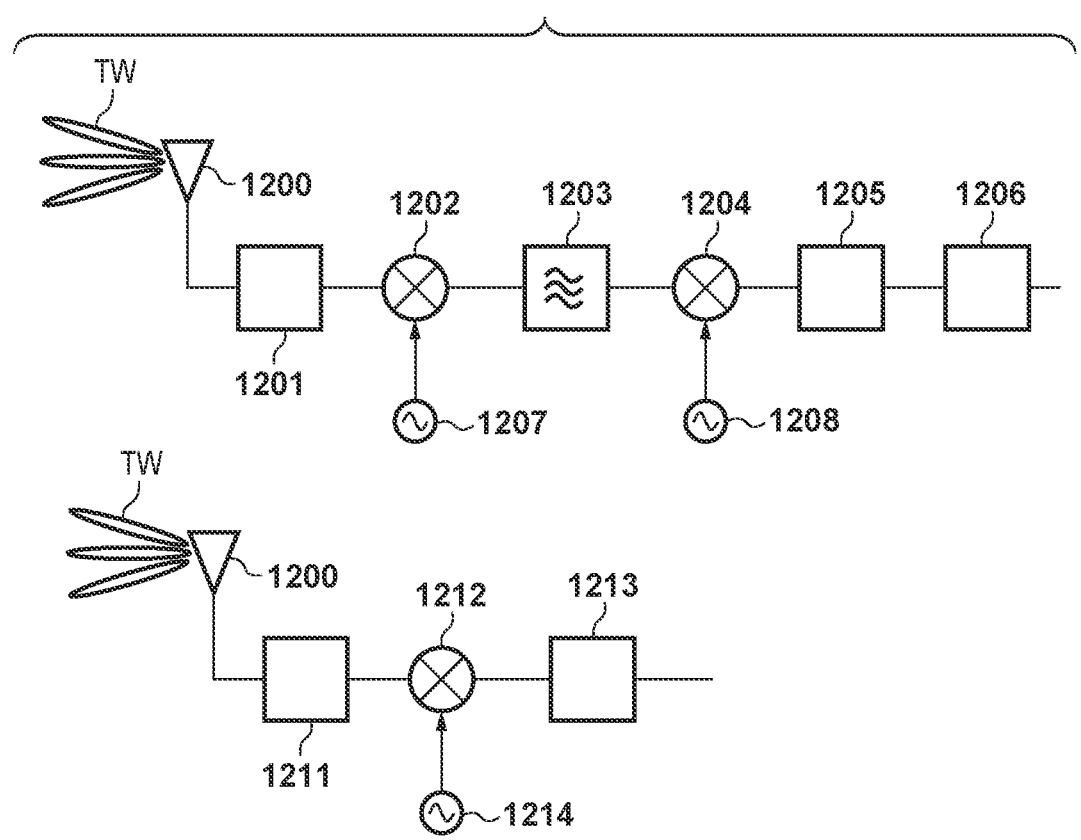
FIG. 9B is a view showing an example of the arrangement of a communication system using an antenna apparatus.

This embodiment will describe a case in which the antenna apparatus of one of the above-described embodiments is applied to a terahertz communication system (communication apparatus). The following description will be provided with reference to FIG. 9B. The antenna apparatus can be used as an antenna 1200 of the communication system. As the communication system, the simple ASK method, superheterodyne method, direct conversion method, or the like is assumed. The communication system using the superheterodyne method includes, for example, the antenna 1200, an amplifier 1201, a mixer 1202, a filter 1203, a mixer 1204, a converter 1205, a digital baseband modulator-demodulator 1206, and local oscillators 1207 and 1208. In the case of a receiver, a terahertz wave received via the antenna 1200 is converted into a signal of an intermediate frequency by the mixer 1202, and is then converted into a baseband signal by the mixer 1204, and an analog waveform is converted into a digital waveform by the converter 1205. After that, the digital waveform is demodulated in the baseband to obtain a communication signal. In the case of a transmitter, after a communication signal is modulated, the communication signal is converted from a digital waveform into an analog waveform by the converter 1205, is frequency-converted via the mixers 1204 and 1202, and is then output as a terahertz wave from the antenna 1200. The communication system using the direct conversion method includes the antenna 1200, an amplifier 1211, a mixer 1212, a modulator-demodulator 1213, and a local oscillator 1214. In the direct conversion method, the mixer 1212 directly converts the received terahertz wave into a baseband signal at the time of reception, and the mixer 1212 converts the baseband signal to be transmitted into a signal in a terahertz band at the time of transmission. The remaining components are similar to those in the superheterodyne method. The antenna apparatus according to each of the above-described embodiments can perform beamforming of a terahertz wave by electric control of a single chip. Therefore, it is possible to align radio waves between the transmitter and the receiver. By using the antenna apparatus of each of the above-described embodiments that can perform beamforming, in the communication system, it is possible to improve radio quality such as a signal-to-noise ratio, and transmit a large capacity of information in a wide coverage area at low cost.

Other Embodiments

The embodiments of the present invention have been described above. However, the present invention is not limited to these embodiments and various modifications and changes can be made within the spirit and scope of the present invention.

For example, each of the above-described embodiments assumes that carriers are electrons. However, the present invention is not limited to this and holes may be used. Furthermore, the materials of the substrate and the dielectric are selected in accordance with an application purpose, and a semiconductor layer of silicon, gallium arsenide, indium arsenide, gallium phosphide, or the like, glass, ceramic, and a resin such as polytetrafluoroethylene or polyethylene terephthalate can be used.

In each of the above-described embodiments, a square patch antenna is used as a terahertz wave resonator but the shape of the resonator is not limited to this. For example, a resonator having a structure using a patch conductor having a polygonal shape such as a rectangular shape or triangular shape, a circular shape, an elliptical shape, or the like may be used.

The number of negative differential resistance elements integrated in an element is not limited to one and a resonator including a plurality of negative differential resistance elements may be used. The number of lines is not limited to one, and an arrangement including a plurality of lines may be used. By using the antenna apparatus described in each of the above embodiments, it is possible to oscillate and detect a terahertz wave.

In each of the above-described embodiments, a double-barrier RTD made of InGaAs/AlAs growing on the InP substrate has been described as an RTD. However, the present invention is not limited to the structure and material system, and even another combination of a structure and a material can provide an element of the present invention. For example, an RTD having a triple-barrier quantum well structure or an RTD having a multi-barrier quantum well structure of four or more barriers may be used.

For example, in some of the above-described embodiments, an example in a case in which the antennas AN included in two active antennas, among the plurality of active antennas, arranged at adjacent positions in the array arrangement are coupled has been explained but the present invention is not limited to this. As long as a wiring is possible, two antennas AN included in two active antennas that are not adjacent to each other may be coupled.

Each of the above-described embodiments has explained the method of forming the antenna apparatus using a stacked structure but the present invention is not limited to this. That is, the above discussion can be applied to an antenna apparatus that uses no stacked structure. In this case, for example, the above-described semiconductor layer 100 can be replaced by a semiconductor structure or an arbitrary oscillation apparatus. By designing another structure in accordance with, for example, one of the circuit diagrams shown in FIGS. 4A to 4C, it is possible to obtain an antenna apparatus having the same performance as that of the antenna apparatus described in the embodiment.

As the material of the RTD, each of the following combinations may be used.
GaAs/AlGaAs, GaAs/AlAs, and InGaAs/GaAs/AlAs formed on a GaAs substrate
InGaAs/InAlAs, InGaAs/AlAs, and InGaAs/AlGaAsSb formed on an InP substrate
InAs/AlAsSb and InAs/AlSb formed on an InAs substrate
SiGe/SiGe formed on an Si substrate The above-described structure and material can appropriately be selected in accordance with a desired frequency and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-067825, filed Apr. 15, 2022 which is hereby incorporated by reference herein in its entirety.

What is claimed is:

1. An antenna apparatus comprising:
an active antenna including an antenna, a semiconductor structure configured to operate as a first oscillator, and at least two power lines configured to give a potential difference to the semiconductor structure, and configured to generate or to detect an electromagnetic wave;
a control line electrically connected to one of the at least two power lines and configured to be injected with a signal for controlling a phase of the first oscillator in the active antenna; and
a second oscillator configured to serve as a master to output the signal for controlling the phase of the first oscillator in the active antenna.

2. The apparatus according to claim 1, wherein the signal is an electric signal of a frequency equal to 1/even number of an oscillation frequency of the first oscillator.

3. The apparatus according to claim 1, wherein the signal is an electric signal that reaches the first oscillator with power not less than power of an output signal from the first oscillator.

4. The apparatus according to claim 3, wherein the signal is an electric signal that reaches the first oscillator with power not less than 10 times the power of the output signal from the first oscillator.

5. The apparatus according to claim 1, wherein a length of a path from the second oscillator, that outputs the signal, to the first oscillator included in the active antenna, that the signal reaches via the control line, is not longer than 20 times a wavelength of the signal.

6. The apparatus according to claim 1, wherein
the at least two power lines include a first power line configured to give a first potential and a second power line configured to give a second potential, and the second potential is higher than the first potential, and
the control line is electrically connected to the second power line.

7. The apparatus according to claim 1, wherein
the at least two power lines include a first power line configured to give a first potential and a second power line configured to give a second potential, and the second potential is higher than the first potential, and
the control line is electrically connected to the first power line.

8. The apparatus according to claim 1, wherein an antenna array in which a plurality of active antennas are arranged in an array is included.

9. The apparatus according to claim 8, further comprising a coupling line configured to mutually couple at least two antennas respectively included in at least two active antennas among the plurality of active antennas.

10. The apparatus according to claim 9, wherein for the coupling line that couples the antennas respectively included in the at least two active antennas arranged adjacent to each other in the array arrangement among the plurality of active antennas, a length of a path in a case where the semiconductor structure included in each of the at least two active antennas is connected via the coupling line is set based on an electrical length of the electromagnetic wave in the coupling line.

11. The apparatus according to claim 10, wherein for the coupling line, the length of the path is set to be the electrical length of the electromagnetic wave which is equal to an integer multiple of $2\pi$.

12. The apparatus according to claim 9, wherein the control line is coupled to the coupling line, and is electrically connected to one of the at least two power lines via the antenna.

13. The apparatus according to claim 9, wherein a length of a path from the second oscillator, that outputs the signal, to the first oscillator included in the active antenna, that the signal reaches via the control line and the coupling line, is a length of an integer multiple of a wavelength of the signal.

14. The apparatus according to claim 9, wherein the antenna, the semiconductor structure, the control line, and the coupling line are stacked on a semiconductor substrate, the control line and the coupling line are arranged in different layers, and the control line and the coupling line are electrically connected at a frequency of the signal.

15. The apparatus according to claim 1, wherein the antenna, the semiconductor structure, and the control line are stacked on a semiconductor substrate.

16. The apparatus according to claim 8, wherein the control line is configured so that a difference between an electrical length of the control line connected to a first active antenna among the plurality of active antennas and an electrical length of the control line connected to a second active antenna among the plurality of active antennas becomes an integer multiple of a wavelength of the signal.

17. The apparatus according to claim 1, wherein the second oscillator that outputs the signal is formed using a semiconductor heterostructure, a semiconductor stacked structure, a resonant tunneling diode, and a negative resistance diode.

18. The apparatus according to claim 1, wherein the electromagnetic wave is an electromagnetic wave in a terahertz band.

19. An antenna apparatus comprising:
a first active antenna including a first antenna, a first semiconductor structure configured to operate as a first oscillator, and at least two power lines configured to give a potential difference to the first semiconductor structure, and configured to serve as a slave to generate or detect an electromagnetic wave;
a second active antenna including a second antenna, a second semiconductor structure configured to operate as a second oscillator, and at least two power lines configured to give a potential difference to the second semiconductor structure, and configured to serve as a slave to generate or detect an electromagnetic wave;
a third oscillator configured to serve as a master to output a signal that controls phases of the first oscillator and the second oscillator;
a first control line configured to electrically connect one of the at least two power lines of the first active antenna to the third oscillator; and
a second control line configured to electrically connect one of the at least two power lines of the second active antenna to the third oscillator.

20. The apparatus according to claim 19, wherein the third oscillator is formed using a semiconductor heterostructure, a semiconductor stacked structure, a resonant tunneling diode, and a negative resistance diode.

21. The apparatus according to claim 19, wherein the electromagnetic wave is an electromagnetic wave in a terahertz band.

22. A communication apparatus comprising:
an antenna apparatus that comprises:
an active antenna including an antenna, a semiconductor structure configured to operate as an oscillator, and at least two power lines configured to give a potential difference to the semiconductor structure, and configured to generate or detect an electromagnetic wave; and
a control line electrically connected to one of the at least two power lines and configured to be injected with a signal for controlling a phase of the oscillator in the active antenna;
a transmission unit configured to emit an electromagnetic wave; and
a reception unit configured to detect the electromagnetic wave.

23. An image capturing system comprising:
an antenna apparatus that comprises:
an active antenna including an antenna, a semiconductor structure configured to operate as an oscillator, and at least two power lines configured to give a potential difference to the semiconductor structure, and configured to generate or detect an electromagnetic wave; and
a control line electrically connected to one of the at least two power lines and configured to be injected with a signal for controlling a phase of the oscillator in the active antenna;
a transmission unit configured to emit an electromagnetic wave;
a transmission unit configured to emit an electromagnetic wave to an object; and
a detection unit configured to detect the electromagnetic wave reflected by the object.

* * * * *